United States Patent
Hur et al.

(10) Patent No.: US 9,362,397 B2
(45) Date of Patent: Jun. 7, 2016

(54) SEMICONDUCTOR DEVICES

(71) Applicant: Samsung Electronics Co., Ltd., Suwon-si, Gyeonggi-do (KR)

(72) Inventors: Sung Gi Hur, Hwaseong-si (KR); Sangsu Kim, Yongin-si (KR); Junggil Yang, Suwon-si (KR); Changjae Yang, Seoul (KR); Dongkyu Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 3 days.

(21) Appl. No.: 14/464,785

(22) Filed: Aug. 21, 2014

(65) Prior Publication Data

US 2015/0084041 A1  Mar. 26, 2015

Related U.S. Application Data

(60) Provisional application No. 61/881,738, filed on Sep. 24, 2013.

(30) Foreign Application Priority Data

Dec. 9, 2013  (KR) .......................... 10-2013-0152427

(51) Int. Cl.
  *H01L 29/78*  (2006.01)
  *H01L 29/66*  (2006.01)
  *H01L 29/12*  (2006.01)

(52) U.S. Cl.
  CPC ............ *H01L 29/7832* (2013.01); *H01L 29/12* (2013.01); *H01L 29/66484* (2013.01); *H01L 29/66787* (2013.01)

(58) Field of Classification Search
  CPC ........................ H01L 27/1211; H01L 21/845
  USPC ............................................ 257/43; 438/103
  See application file for complete search history.

(56) References Cited

U.S. PATENT DOCUMENTS 7,795,687 B2  9/2010  Suk et al.
7,838,367 B2  11/2010  Ponomarev et al.
(Continued)

FOREIGN PATENT DOCUMENTS

JP  H 07-135325 A  5/1995
JP  2004-006736 A  1/2004
(Continued)

OTHER PUBLICATIONS

Kim et al. "Twin Silicon Nanowire FET (TSNWFET) on SOI With 8nm Silicon Nanowires and 25nm Surrounding TiN Gate", *2008 IEEE International SOI Conference Proceedings*, 2008, pp. 117-118.
Spadafora et al. "Oxidation rate enhancement of SiGe epitaxial films oxidized in dry ambient", *Applied Physics Letters*, 83: 3713 (2003).

*Primary Examiner* — Cuong Q Nguyen
*Assistant Examiner* — Tong-Ho Kim
(74) *Attorney, Agent, or Firm* — Myers Bigel & Sibley, P.A.

(57) ABSTRACT

A gate-all-around (GAA) semiconductor device can include a fin structure that includes alternatingly layered first and second semiconductor patterns. A source region can extend into the alternatingly layered first and second semiconductor patterns and a drain region can extend into the alternatingly layered first and second semiconductor patterns. A gate electrode can extend between the source region and the drain region and surround channel portions of the second semiconductor patterns between the source region and the drain region to define gaps between the source and drain regions. A semiconductor oxide can be on first side walls of the gap that face the source and drain regions and can be absent from at least one of second side walls of the gaps that face the second semiconductor patterns. A gate insulating layer can be on the first side walls of the gaps between the gate electrode and the semiconductor oxide.

12 Claims, 23 Drawing Sheets

(56) References Cited

U.S. PATENT DOCUMENTS

| | | |
|---|---|---|
| 8,395,218 B2 | 3/2013 | Suk et al. |
| 2005/0266645 A1* | 12/2005 | Park .............................. 438/282 |
| 2005/0272231 A1 | 12/2005 | Yun et al. |
| 2006/0216897 A1 | 9/2006 | Lee et al. |
| 2008/0020537 A1* | 1/2008 | Kim et al. .................... 438/308 |
| 2010/0047973 A1* | 2/2010 | Barbe et al. .................. 438/151 |

FOREIGN PATENT DOCUMENTS

| | | |
|---|---|---|
| JP | 2011-003797 A | 1/2011 |
| KR | 10-2005-0116707 A | 12/2005 |
| KR | 10-0707208 B1 | 4/2007 |
| KR | 10-2011-0005120 A | 1/2011 |

* cited by examiner

1200

SEMICONDUCTOR DEVICES

CROSS-REFERENCE TO RELATED APPLICATIONS

This U.S. non-provisional patent application claims priority under 35 U.S.C. §119 to Korean Patent Application No. 10-2013-0152427, filed on Dec. 9, 2013, in the Korean Intellectual Property Office, and to U.S. Provisional Patent Application No. 61/881,738, filed on Sep. 24, 2013, the entire contents of both of which are hereby incorporated by reference.

BACKGROUND

Example embodiments of the inventive concept relate to semiconductor devices and methods of fabricating the same, and in particular, to semiconductor devices with field effect transistors and methods of fabricating the same.

A memory device can be used to store data, a logic device can be used for processing data, and a hybrid device can include both memory and logic elements. Due to the increased demand for high speed/low power electronic devices, semiconductor devices are needed to provide high reliability, high performance, and/or multiple functions. To satisfy these technical requirements, the complexity and/or integration density of related semiconductor devices have increased.

SUMMARY

Embodiments according to the inventive concept can provide a gate-all-around (GAA) semiconductor device which can include a fin structure that includes alternatingly layered first and second semiconductor patterns. A source region can extend into the alternatingly layered first and second semiconductor patterns and a drain region can extend into the alternatingly layered first and second semiconductor patterns. A gate electrode can extend between the source region and the drain region and surround channel portions of the second semiconductor patterns between the source region and the drain region to define gaps between the source and drain regions. A semiconductor oxide can be on first side walls of the gap that face the source and drain regions and can be absent from at least one of second side walls of the gaps that face the second semiconductor patterns. A gate insulating layer can be on the first side walls of the gaps between the gate electrode and the semiconductor oxide.

In some embodiments according to the inventive concept, the semiconductor oxide has a dielectric constant that is less than that of the gate insulating layer. In some embodiments according to the inventive concept, the semiconductor oxide is located on lowest one of the second side walls between the gate electrode and the substrate.

In some embodiments according to the inventive concept, the gate insulating layer surrounds the channel portions. In some embodiments according to the inventive concept, the gate insulating layer contacts the channel portions.

In some embodiments according to the inventive concept, a semiconductor device can include a first semiconductor pattern and a second semiconductor pattern that are sequentially stacked on one another on a substrate. A gate electrode can be on the second semiconductor pattern and extend into a gap region delimited by a sidewall of the first semiconductor pattern and a bottom surface of the second semiconductor pattern. A gate insulating layer can be between the gate electrode and the first and second semiconductor patterns and a semiconductor oxide can be between the gate insulating layer and the first semiconductor pattern, where the semiconductor oxide has a dielectric constant that is less than that of the gate insulating layer, wherein the semiconductor oxide can extend between the gate electrode and the substrate.

In some embodiments according to the inventive concept, a method of fabricating a semiconductor device can be provided by sequentially forming first and second semiconductor layers on a substrate. The first and second semiconductor layers can be patterned to form first and second semiconductor patterns. A gap region can be formed horizontally penetrating the first semiconductor pattern. A semiconductor oxide can be formed to cover a surface of the first semiconductor pattern and a surface of the second semiconductor pattern each exposed in the gap region. The semiconductor oxide can be removed from the surface of the second semiconductor pattern in the gap region and a gate insulating layer and a gate electrode can be sequentially formed in the gap region.

BRIEF DESCRIPTION OF THE DRAWINGS

The accompanying drawings represent non-limiting, example embodiments as described herein.

Figure 1:
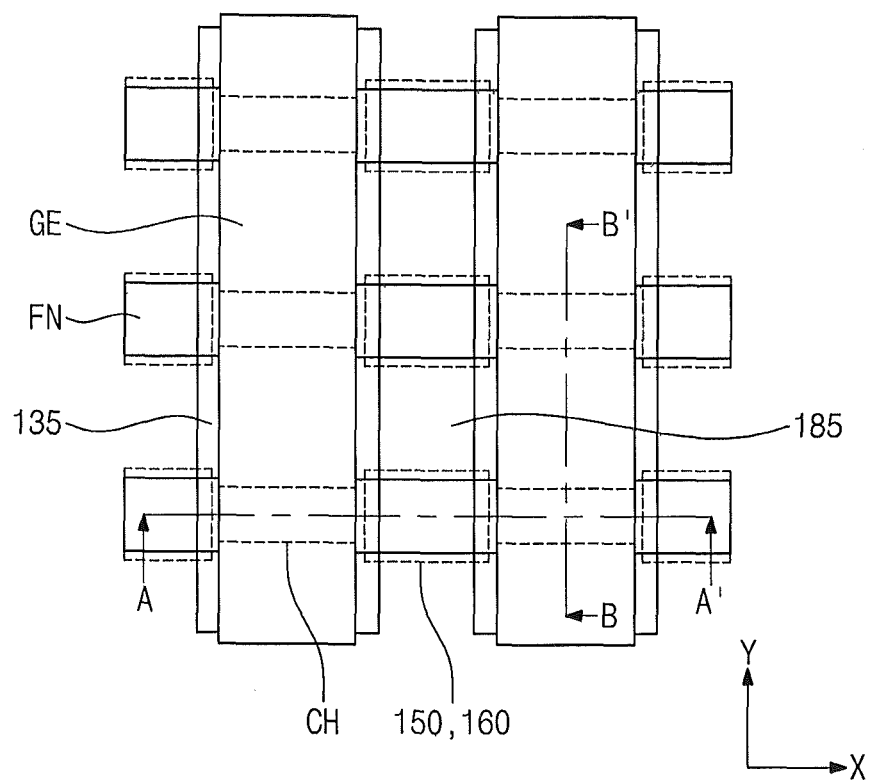
FIG. 1 is a schematic plan view illustrating semiconductor devices according to embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
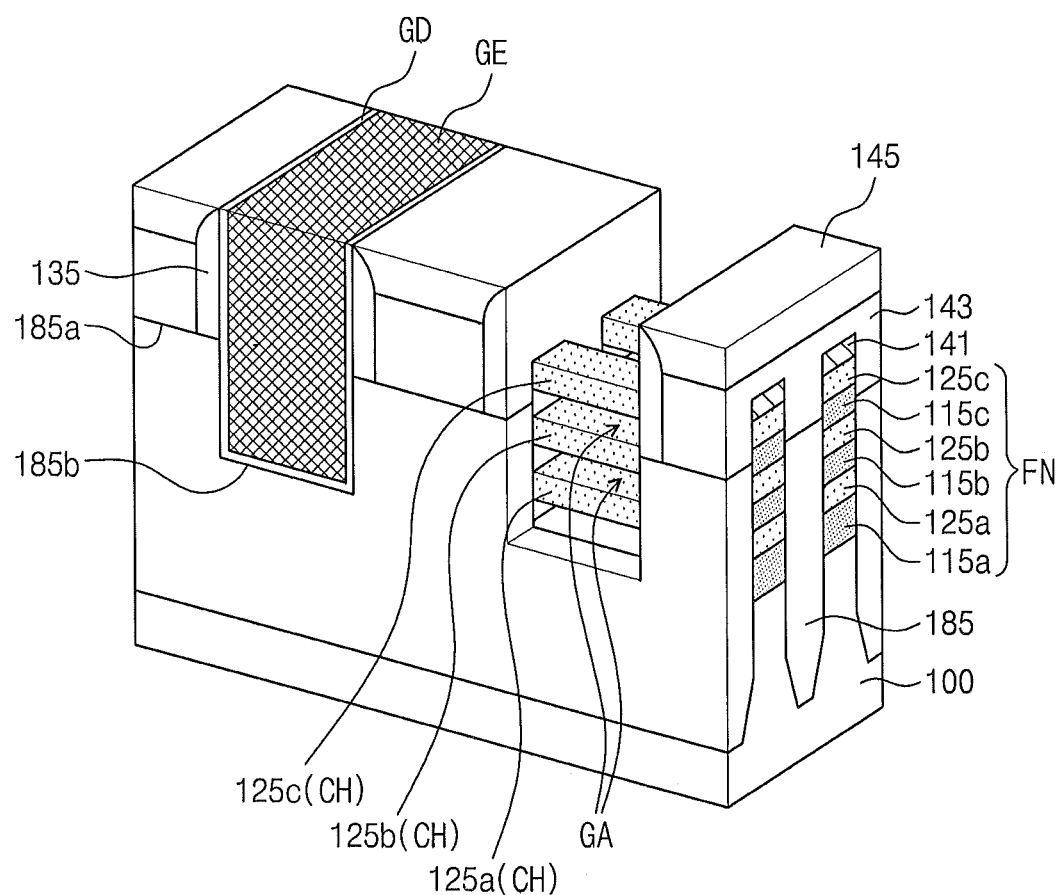
FIG. 2 is a perspective view illustrating semiconductor devices according to example embodiments of the inventive concept.
Figure 3:
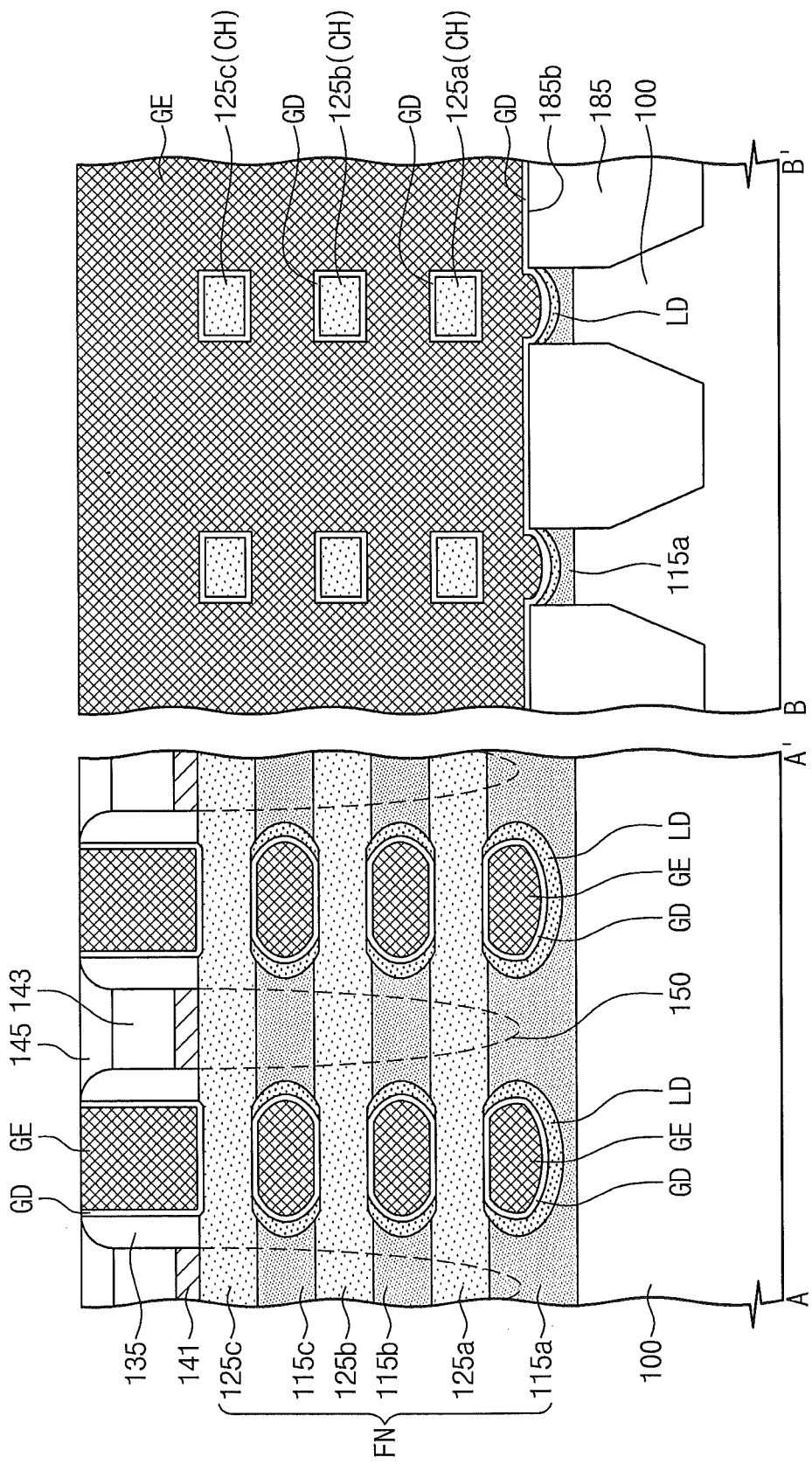
FIG. 3 is a sectional view illustrating sections taken along lines A-A' and B-B' of FIG. 1 to illustrate semiconductor devices according to example embodiments of the inventive concept.

FIG. 1 is a schematic plan view illustrating semiconductor devices according to some embodiments of the inventive concept, and FIG. 2 is a perspective view illustrating semiconductor devices according to example embodiments of the inventive concept. In order to reduce complexity in the drawings and to provide better understanding of example embodiments of the inventive concept, some elements of three-dimensional semiconductor devices may be omitted in FIG. 2. FIG. 3 is a sectional view illustrating sections taken along lines A-A' and B-B' of FIG. 1 to illustrate semiconductor devices according to example embodiments of the inventive concept.

Referring to FIGS. 1 through 3, according to example embodiments of the inventive concept, a semiconductor device may include stacks FN provided on a substrate 100. The stacks FN may extend parallel to a first direction (hereinafter, referred to as an x direction) and may be spaced apart from each other in a second direction (hereinafter, referred to as a y direction) crossing the first direction. The substrate 100 may be a semiconductor wafer including at least one of a silicon layer, a germanium layer, or a silicon-germanium layer, or a compound semiconductor wafer, and may have a first conductivity type. Each of the stacks FN may include sacrificial semiconductor patterns 115a, 115b, and 115c and channel semiconductor patterns 125a, 125b, and 125c, which may be alternatively and repeatedly stacked on the substrate 100. For example, each of the stacks FN may include the first sacrificial semiconductor pattern 115a and the first channel semiconductor pattern 125a, which are sequentially stacked on the substrate 100, and in example embodiments, as shown in FIG. 2, it may further include the second and third sacrificial semiconductor patterns 115b and 115c and the second and third channel semiconductor patterns 125b and 125c, which are alternatively and repeatedly stacked on the first channel semiconductor pattern 125a. Although three sacrificial semiconductor patterns 115a, 115b, and 115c and three channel semiconductor patterns 125a, 125b, and 125c are illustrated in the drawings, example embodiments of the inventive concept are not limited thereto. The sacrificial semiconductor patterns 115a, 115b, and 115c and the channel semiconductor patterns 125a, 125b, and 125c may be epitaxial layers formed by an epitaxial growth process.

The sacrificial semiconductor patterns 115a, 115b, and 115c may include a material having an etch selectivity with respect to the channel semiconductor patterns 125a, 125b, and 125c. For example, when the sacrificial semiconductor patterns 115a, 115b, and 115c are etched using a predetermined etch recipe, the sacrificial semiconductor patterns 115a, 115b, and 115c may be formed of a material that can be selectively etched, while preventing the channel semiconductor patterns 125a, 125b, and 125c from being etched. The etch selectivity may be quantitatively expressed as a ratio in etch rate of the sacrificial semiconductor patterns 115a, 115b, and 115c to the etch rate of the channel semiconductor patterns 125a, 125b, and 125c. For example, the sacrificial semiconductor patterns 115a, 115b, and 115c may be formed of or include one of materials capable of having an etch selectivity ranging from 10:1 to 200:1, with respect to the channel semiconductor patterns 125a, 125b, and 125c. In addition, the sacrificial semiconductor patterns 115a, 115b, and 115c may be formed of or include one or more materials having an oxidation rate greater than that of the channel semiconductor patterns 125a, 125b, and 125c. As an example, the sacrificial semiconductor patterns 115a, 115b, and 115c may include SiGe, and the channel semiconductor patterns 125a, 125b, and 125c may include Si. As another example, the sacrificial semiconductor patterns 115a, 115b, and 115c may include InGaAs, and the channel semiconductor patterns 125a, 125b, and 125c may include InP.

In certain embodiments, at least one of the sacrificial semiconductor patterns 115a, 115b, and 115c may have a thickness different from the others. For example, the first sacrificial semiconductor pattern 115a closest to the substrate 100 may be thicker than the second and third sacrificial semiconductor patterns 115b and 115c thereon. In other embodiments, the channel semiconductor patterns 125a, 125b, and 125c may have thicknesses, all of which are substantially equivalent to or different from each other.

Each of the stacks FN may include a plurality of channel regions CH, which are provided at different levels spaced apart from the substrate 100 in a vertical direction. The channel regions CH may be portions of the first to third channel semiconductor patterns 125a, 125b, and 125c. In example embodiments, the channel regions CH may have a rectangular section, but embodiments of the inventive concept are not limited thereto. Further, each of the stacks FN may include source/drain regions 150, which are spaced apart from each other, in the x direction, with the channel regions CH interposed therebetween. The source/drain regions 150 may be impurity regions, which are formed in the channel and sacrificial semiconductor patterns by a doping process (e.g., an ion implantation process), and may be formed to have a second conductivity type different from that of the substrate 100. For example, the source/drain regions 150 may extend from the third channel semiconductor pattern 125c to the first sacrificial semiconductor pattern 115a.

As shown in FIG. 2, a gate electrode GE may be provided to cross-over/under the channel regions CH. For example, the gate electrode GE may be provided between the channel regions CH. Hereinafter, gap regions GA are used to denote regions between the channel regions CH in the vertical direction beneath the gate electrode GE.

In detail, a gate insulating layer GD and the gate electrode GE may be sequentially provided on the channel regions CH of the stacks FN. The gate insulating layer GD and the gate electrode GE may extend into the gap regions GA and parallel to the y direction. For example, the gate insulating layer GD and the gate electrode GE may cover top, bottom, and side surfaces of the channel regions CH. The gate insulating layer GD and the gate electrode GE may be provided to enclose an outer surface of each of the channel regions CH, and thus, each of the channel regions CH may be disposed to penetrate the gate electrode GE. In example embodiments, the first sacrificial semiconductor pattern 115a may include at least a portion interposed between the substrate 100 and the gate electrode GE. For example, the first sacrificial semiconductor pattern 115a may include a portion, whose top surface is covered with portions of the gate insulating layer GD and the gate electrode GE positioned below the channel regions CH.

The gate insulating layer GD may include at least one high-k dielectric material. As an example, the gate insulating layer GD may include at least one of $HfO_2$, $ZrO_2$, or $Ta_2O_5$. The gate electrode GE may include a conductive metal nitride or a metallic material. In other words, the gate electrode GE may have a metal gate structure.

In example embodiments, a semiconductor oxide LD may be provided between the gate insulating layer GD and the sacrificial semiconductor patterns 115a, 115b, and 115c. For example, the semiconductor oxide LD may be provided between sidewalls of the gate insulating layer GD and the sacrificial semiconductor patterns 115a, 115b, and 115c and between the gate insulating layer GD and a top surface of the portion of the first sacrificial semiconductor pattern 115a positioned below a level of the channel regions CH. The semiconductor oxide LD may include a material having a dielectric constant less than that of the gate insulating layer GD. For example, the semiconductor oxide LD may include a layer of silicon-germanium oxide. The presence of the semiconductor oxide LD makes it possible to reduce parasitic capacitance, which may occur between the gate electrode GE and the sacrificial semiconductor patterns 115a, 115b, and 115c, in both horizontal and vertical directions. In some embodiments, this can be attributed to the semiconductor oxide LD between the gate electrode GE and the sacrificial semiconductor patterns 115a, 115b, and 115c having a low dielectric constant (e.g., less than that of the gate insulating layer GD).

Device isolation patterns 185 may be provided on the substrate 100. The device isolation patterns 185 may include at least one of silicon oxide, silicon nitride, and silicon oxynitride. In example embodiments, an uppermost top surface 185a of the device isolation patterns 185, as shown FIG. 2, may be positioned at a level that is lower than the top surface of the third channel semiconductor pattern 125c and is lower than the bottom surface of the third channel semiconductor pattern 125c. A top surface 185b of the device isolation patterns 185 under the gate electrode GE may be positioned at a level that is lower than the bottom surface of the first channel semiconductor pattern 125a and is higher than the bottom surface of the first sacrificial semiconductor pattern 115a.

Spacers 135 may be provided at both sides of the gate electrode GE. For example, the spacers 135 may be provided on the third channel semiconductor pattern 125c and extend along the gate electrode GE parallel to the y direction. The spacers 135 may include at least one of a silicon nitride layer or a silicon oxynitride layer. Capping semiconductor patterns 141 may be provided on the third channel semiconductor pattern 125c between the gate electrodes GE to fill spaces between the spacers 135. The capping semiconductor patterns 141 may be two-dimensionally arranged, when viewed in a plan view. For example, the capping semiconductor patterns 141 may be provided on the source/drain regions 150 to be spaced apart from each other in the x and y directions. The capping semiconductor patterns 141 may be epitaxial layers formed by an epitaxial growth process. As an example, the capping semiconductor patterns 141 may be silicon patterns having a substantially single-crystalline structure.

An interlayered insulating layer 143 may be provided on the device isolation patterns 185 to cover the capping semiconductor pattern 141 and extend parallel to the y direction. The interlayered insulating layer 143 may include a silicon oxide layer. A capping insulating layer 145 may be formed on the interlayered insulating layer 143 to cover upper surfaces of the spacers 135 and expose the top surface of the gate electrode GE. The capping insulating layer 145 may have a top surface that is coplanar with that of the top surface of the gate electrode GE. The capping insulating layer 145 may include a high-density plasma (HDP) oxide layer or a silicon nitride layer.

According to example embodiments of the inventive concept, the semiconductor device may include a gate-all-around (GAA) field effect transistor. For example, the field effect transistor may include at least one channel region CH, which is enclosed by a gate insulating layer GD and a gate electrode GE. Here, the at least one channel region CH is formed to have a width ranging from several nanometers to several tens of nanometers and thereby to have a nanowire or nanotube structure. Accordingly, it is possible to reduce the magnitude of the electric field exerted from the source/drain regions to the channel region CH and thereby suppress a short channel effect of the transistor. In addition, since the gate insulating layer GD is formed of or includes a high-k dielectric material, it is possible to decrease a gate leakage current, compared with the case that a silicon oxide layer is used for the gate insulating layer GD.

Furthermore, the semiconductor device may include a semiconductor oxide layer LD provided between the gate insulating layer GD and the sacrificial semiconductor patterns. The semiconductor oxide layer LD may be provided to have a dielectric constant lower than that of the gate insulating layer GD, and this makes it possible to reduce parasitic capacitance between the gate electrode GE and the sacrificial semiconductor patterns 115a-c. As a result, the semiconductor device may have improved electric characteristics.

FIGS. 4 through 16 are sectional views illustrating methods of fabricating semiconductor devices according to example embodiments of the inventive concept. FIGS. 4 through 13 and 15 are sectional views taken along lines A-A' and B-B' of FIG. 1, and FIGS. 14 and 16 are sectional views magnifying a portion A of FIG. 13 and a portion B of FIG. 15, respectively, to describe a semiconductor oxide.

Figure 4:
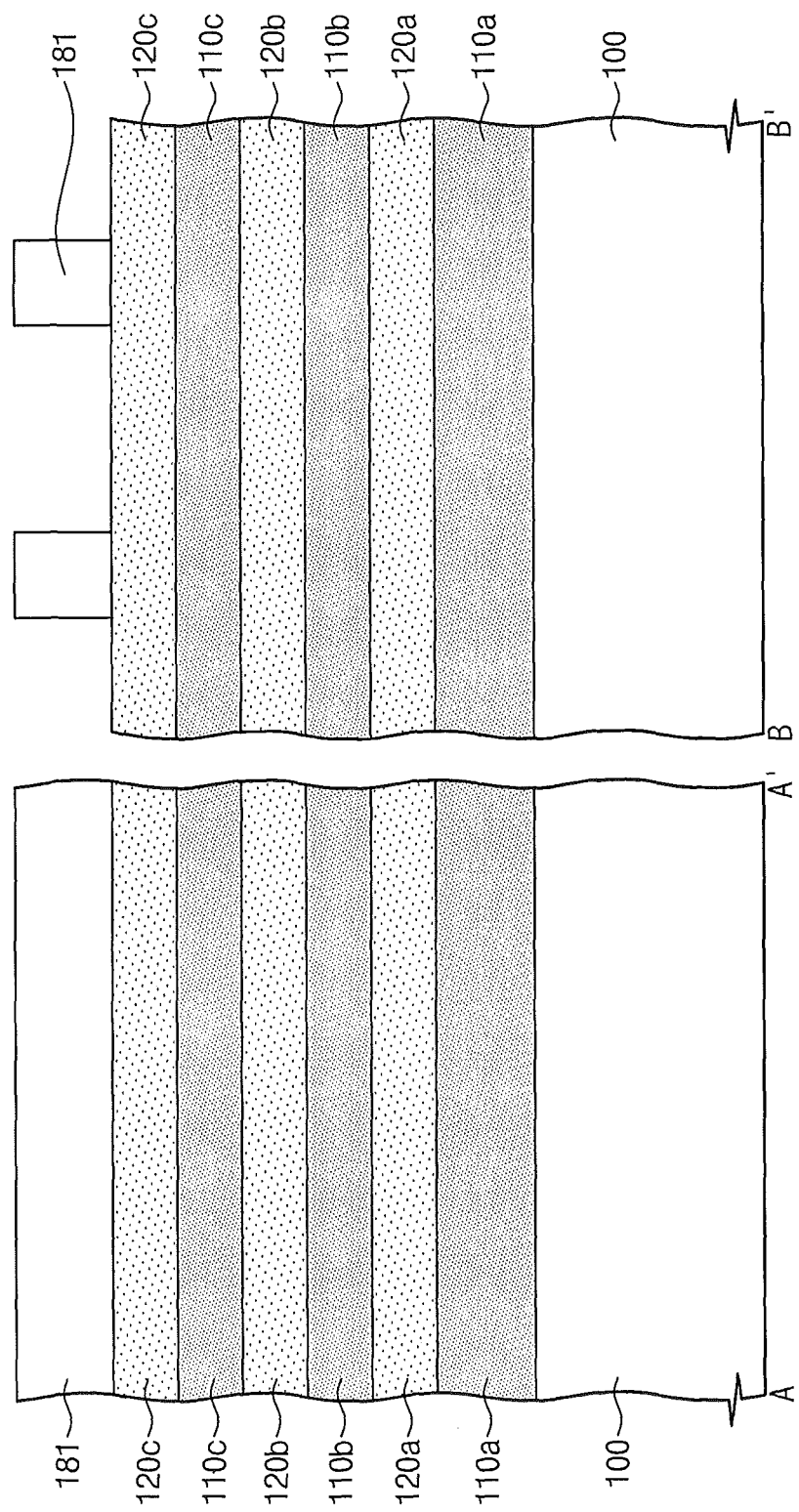
FIGS. 4 through 13 and 15 are sectional views taken along lines A-A' and B-B' of FIG. 1 to illustrate methods of fabricating semiconductor devices according to example embodiments of the inventive concept.

Referring to FIGS. 1 and 4, sacrificial semiconductor layers 110a, 110b, and 110c and channel semiconductor layers 120a, 120b, and 120c may be alternatingly and repeatedly formed on the substrate 100. Although three sacrificial semiconductor layers 110a, 110b, and 110c and three channel semiconductor layers 120a, 120b, and 120c are illustrated in the drawings, example embodiments of the inventive concept are not limited thereto. For example, the sacrificial and channel semiconductor layers may be stacked in such a way that the number of layers constituting each of them is larger than or smaller than three. The substrate 100 may be a semiconductor wafer including at least one of a silicon layer, a germanium layer, or a silicon-germanium layer, or a compound semiconductor wafer, and may have the first conductivity type.

The sacrificial semiconductor layers 110a, 110b, and 110c may include one or more materials having an etch selectivity with respect to the channel semiconductor layers 120a, 120b, and 120c. For example, when the sacrificial semiconductor layers 110a, 110b, and 110c are etched using a specific etch recipe, the sacrificial semiconductor layers 110a, 110b, and 110c may be formed of a material exhibiting a sufficiently high etch rate, compared with an etch rate of the channel semiconductor layers 120a, 120b, and 120c. The etch selectivity may be quantitatively expressed as a ratio in etch rate of the sacrificial semiconductor layers 110a, 110b, and 110c to the channel semiconductor layers 120a, 120b, and 120c. For example, the sacrificial semiconductor layers 110a, 110b, and 110c may be formed of or include materials capable of having an etch selectivity ranging from 10:1 to 200:1, with respect to the channel semiconductor layers 120a, 120b, and 120c, when the sacrificial semiconductor layers 110a, 110b, and 110c are etched using a particular etch recipe. Furthermore, the sacrificial semiconductor layers 110a, 110b, and 110c may be formed of or include one or more materials having an oxidation rate greater than that of the channel semiconductor layers 120a, 120b, and 120c. As an example, the sacrificial semiconductor layers 110a, 110b, and 110c may be formed of or include SiGe, and the channel semiconductor layers 120a, 120b, and 120c may be formed of or include Si. As another example, the sacrificial semiconductor layers 110a, 110b, and 110c may be formed of or include InGaAs, and the channel semiconductor layers 120a, 120b, and 120c may be formed of or include InP.

The sacrificial semiconductor layers 110a, 110b, and 110c and the channel semiconductor layers 120a, 120b, and 120c may be formed by an epitaxial growth process using the substrate 100 as a seed layer. For example, the epitaxial growth process may be a chemical vapor deposition (CVD) process or a molecular beam epitaxy (MBE) process. The sacrificial semiconductor layers 110a, 110b, and 110c and the channel semiconductor layers 120a, 120b, and 120c may be successively formed in the same chamber. The sacrificial semiconductor layers 110a, 110b, and 110c and the channel semiconductor layers 120a, 120b, and 120c may be conformally formed on the whole top surface of the substrate 100, not in a selective manner through the selective epitaxial growth.

In example embodiments, at least one of the sacrificial semiconductor layers 110a, 110b, and 110c may be formed to have a thickness different from the others. For example, the first sacrificial semiconductor layer 110a adjacent to the substrate 100 may be formed thicker than the second and third sacrificial semiconductor layers 110b and 110c. In other embodiments, the channel semiconductor layers 120a, 120b, and 120c may be provided to have thicknesses, all of which are substantially equivalent to or different from each other.

First mask patterns 181 may be formed on the third channel semiconductor layer 120c. The first mask patterns 181 may be formed parallel to the first direction (i.e., the x direction) and may be spaced apart from each other in the second direction (i.e., the y direction) crossing the first direction. The first mask patterns 181 may include at least one of photoresist, silicon nitride, silicon oxide, or silicon oxynitride. The first mask patterns 181 may be formed by a CVD process and a patterning process.

Figure 5:
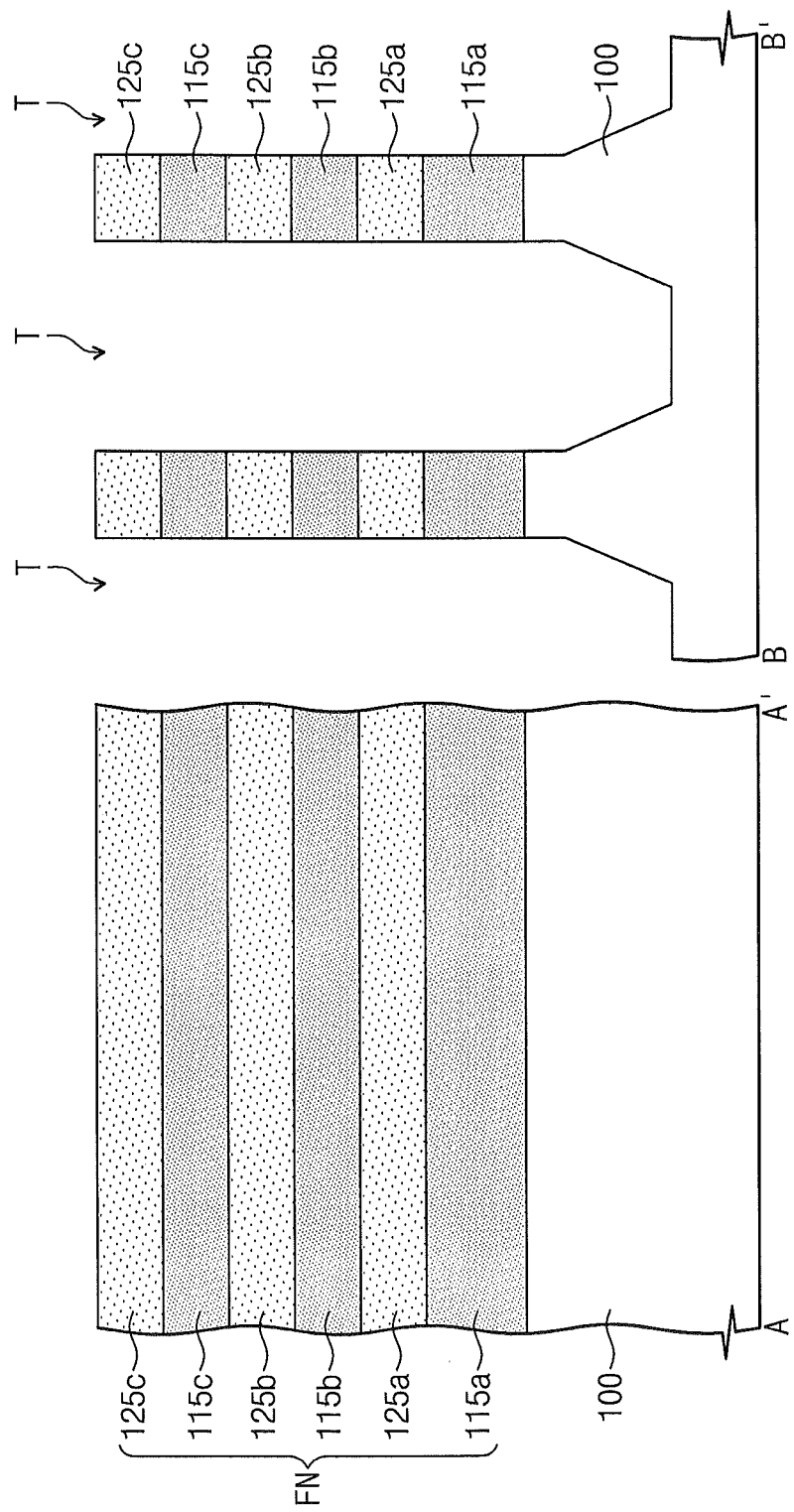

Referring to FIGS. 1 and 5, the stacks FN may be formed on the substrate 100. Each of the stacks FN may include the sacrificial semiconductor patterns 115a, 115b, and 115c and the channel semiconductor patterns 125a, 125b, and 125c, which are sequentially stacked on the substrate 100.

For example, the formation of the stacks FN may include anisotropically etching the sacrificial semiconductor layers 110a, 110b, and 110c and the channel semiconductor layers 120a, 120b, and 120c of FIG. 4 using the first mask patterns 181 of FIG. 4 as an etch mask. Accordingly, the sacrificial semiconductor layers 110a, 110b, and 110c and the channel semiconductor layers 120a, 120b, and 120c of FIG. 4 may be patterned to form the first to third sacrificial semiconductor patterns 115a, 115b, and 115c and the first to third channel semiconductor patterns 125a, 125b, and 125c. The stacks FN may be formed to define trenches T therebetween. In example embodiments, the trenches T may be formed to expose portions of the substrate 100. The formation of the stacks FN may be formed by over-etching top portions of the substrate 100 exposed by the trenches T and may be recessed to a specific depth.

The stacks FN may be spaced apart from each other in the y direction and each of them may be shaped like a line or bar extending in the x direction. After the formation of the stacks FN, the first mask patterns 181 of FIG. 4 may be removed.

Figure 6:
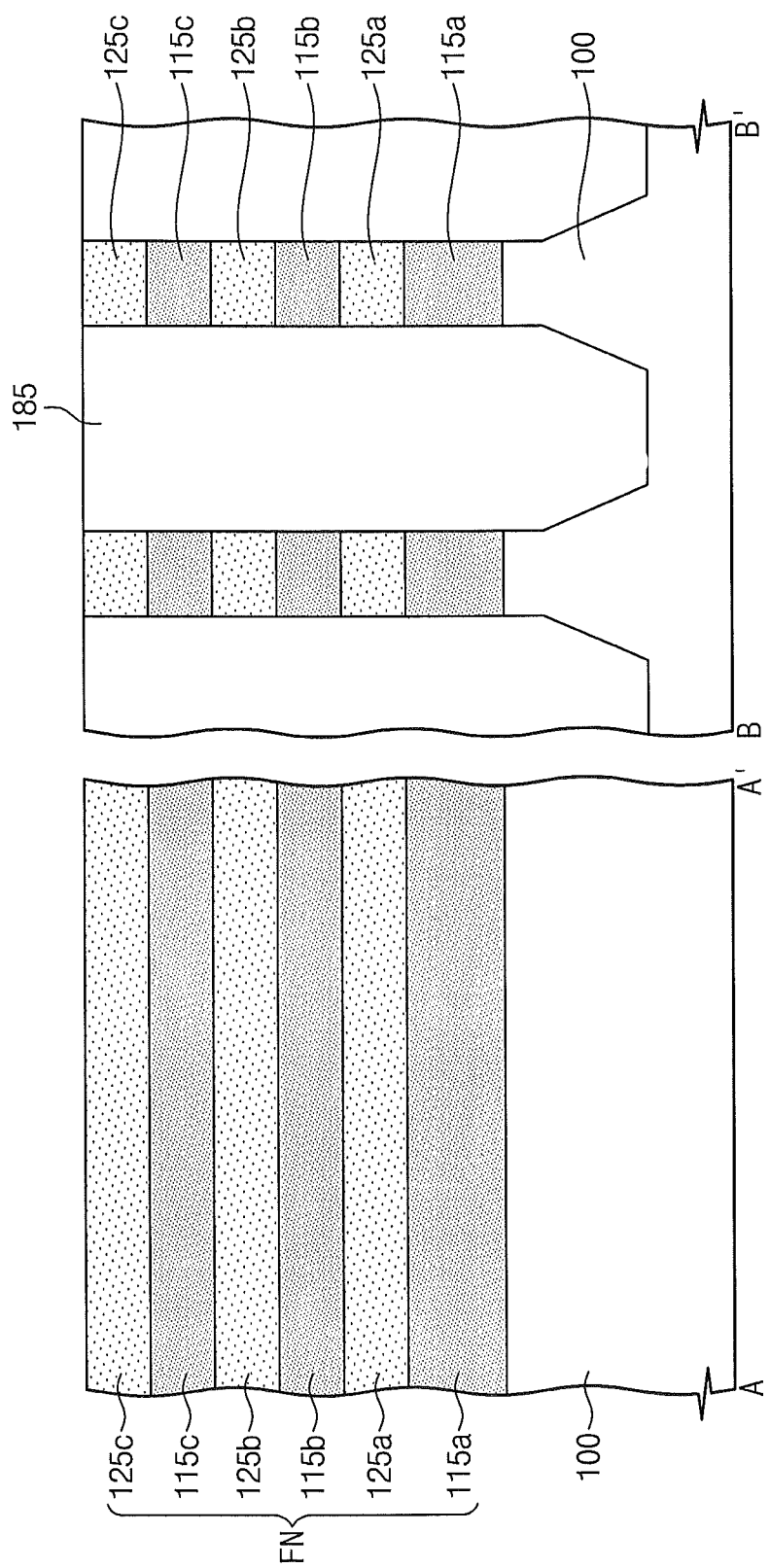

Referring to FIGS. 1 and 6, the device isolation patterns 185 may be formed on the substrate 100 so that the top surface of the third channel semiconductor pattern 125c remains exposed.

For example, the formation of the device isolation patterns 185 may include forming an insulating device isolation layer on the substrate 100 using a CVD process to fill the trenches T, and planarizing the surface of the insulating device isolation layer to expose the top surface of the third channel semiconductor pattern 125c. For example, the insulating device isolation layer may include at least one of silicon oxide, silicon nitride, or silicon oxynitride.

Figure 7:
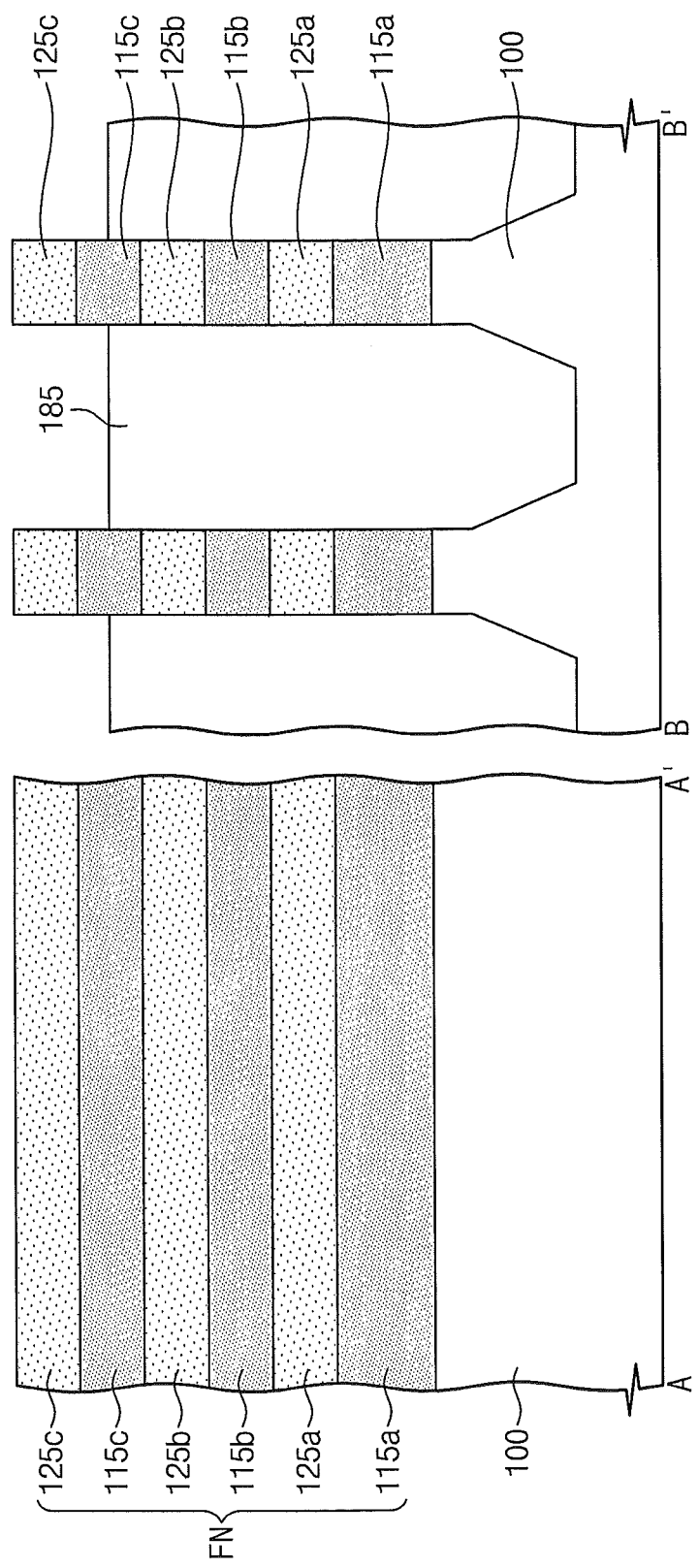

Referring to FIGS. 1 and 7, the device isolation patterns 185 may be recessed to expose sidewalls of the third sacrificial semiconductor patterns 115c and the third channel semiconductor patterns 125c.

For example, the device isolation patterns 185 may be recessed to wholly expose the sidewalls of the third channel semiconductor patterns 125c in the trench T and to partially expose the sidewalls of the third sacrificial semiconductor patterns 115c. In other words, the recessed top surfaces of the device isolation patterns 185 may be positioned between the top and bottom surfaces of the third sacrificial semiconductor patterns 115c. The recessing of the device isolation patterns 185 may be performed using a wet or dry etching process.

Figure 8:
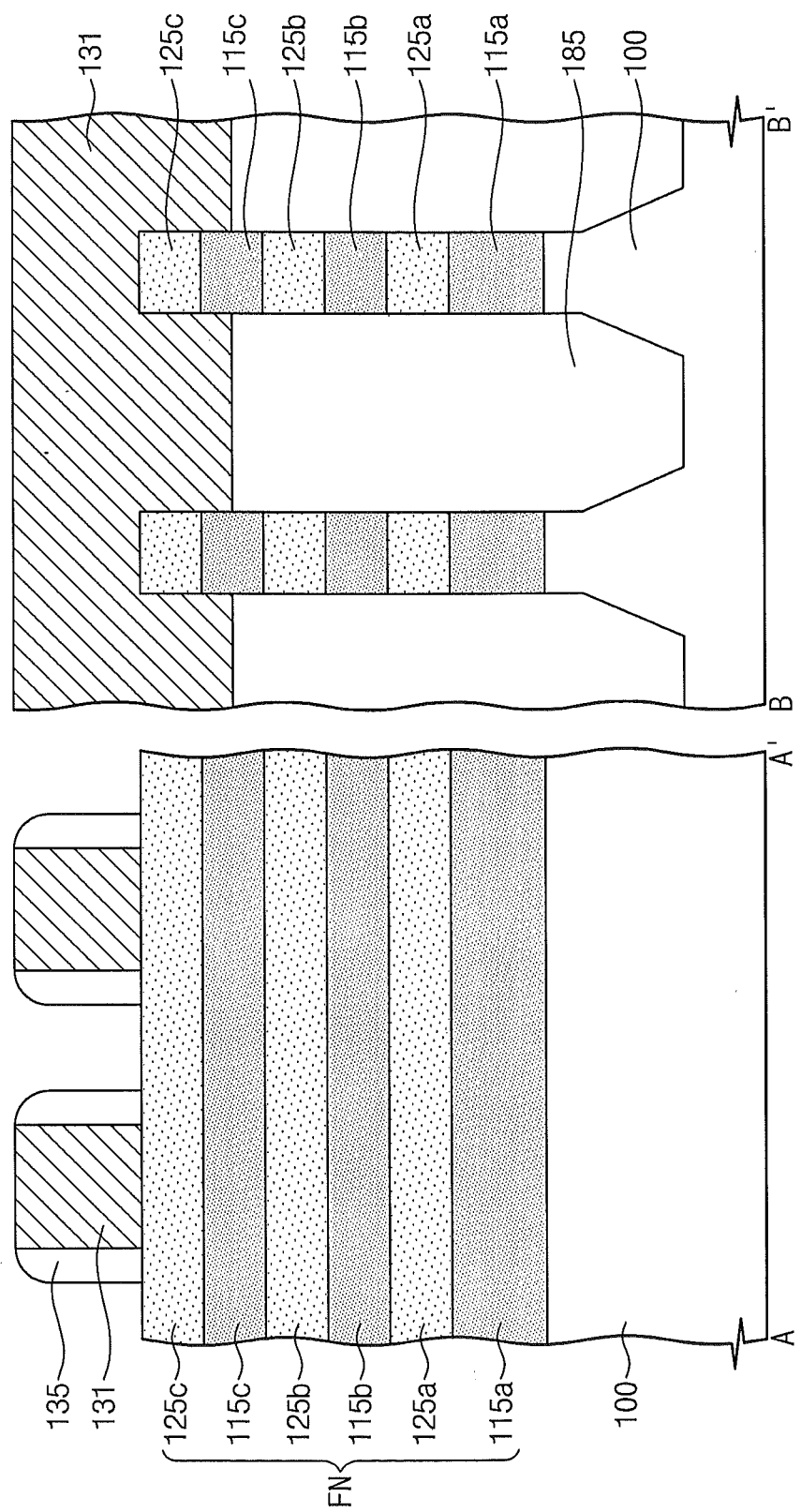

Referring to FIGS. 1 and 8, dummy gate patterns 131 and the spacers 135 may be formed.

For example, the formation of the dummy gate patterns 131 may include forming a gate layer on the recessed top surfaces of the device isolation patterns 185 to cover the stacks FN, and planarizing and patterning the gate layer. The planarization process may include a chemical mechanical polishing process. As the result of the planarization process, the dummy gate patterns 131 may have a flat top surface. The patterning process may include forming a mask pattern on the planarized gate layer, and then, anisotropically etching the gate layer using the mask pattern as an etch mask. As the result of the patterning process, the dummy gate patterns 131 may be spaced apart from each other in x direction and each of them may be shaped like a line or bar extending in the y direction. The gate layer may be formed of a semiconductor material containing at least one of silicon, germanium, or silicongermanium, but example embodiments of the inventive concept are not limited thereto.

The formation of the spacers 135 may include conformally forming a spacer layer on the structure with the dummy gate patterns 131 and then anisotropically etching the spacer layer without any etch mask (e.g., by an etch-back process). The spacer layer may be formed of an insulating material. For example, the spacer layer may be formed of or include a silicon nitride layer and/or a silicon oxynitride layer. The spacer layer may be formed using a deposition process capable of providing a good step coverage property such as a chemical vapor deposition (CVD) process or an atomic layer deposition (ALD) process. In example embodiments, an etch-back process of the spacer layer may be performed to expose the stacks FN between the dummy gate patterns 131. Further, the top surfaces of the dummy gate patterns 131 may be exposed after the etch-back process of the spacer layer.

Figure 9:
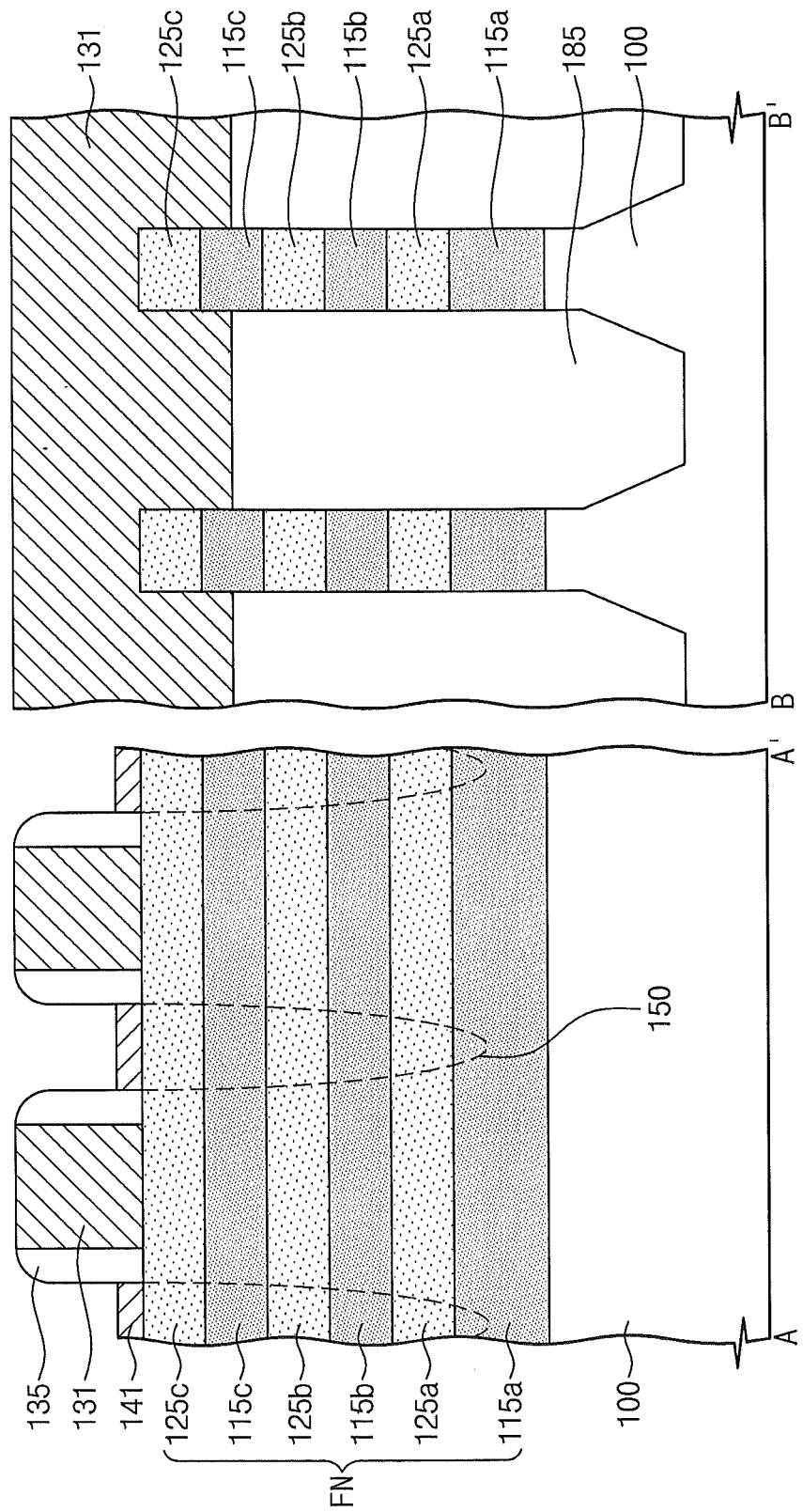

Referring to FIGS. 1 and 9, the capping semiconductor patterns 141 may be formed on the third channel semiconductor patterns 125c between the dummy gate patterns 131 with the spacers 135.

For example, the formation of the capping semiconductor patterns 141 may include forming a mask pattern on the structure of FIG. 8 to cover the top surfaces of the dummy gate patterns 131 and the spacers 135, and then, performing an epitaxial growth process, in which the third channel semiconductor patterns 125c are used as a seed layer. The capping semiconductor patterns 141 may be two-dimensionally arranged, when viewed in a plan view. For example, the capping semiconductor patterns 141 may be formed on the third channel semiconductor patterns 125c to be spaced apart from each other in the x and y directions. The capping semiconductor patterns 141 may include an epitaxial layer. For example, the capping semiconductor patterns 141 may be silicon patterns having a substantially single-crystalline structure.

An ion implantation process may be performed to the structure with the capping semiconductor patterns 141. As a result, the source/drain regions 150 may be formed in the stacks FN below the capping semiconductor patterns 141. The source/drain regions 150 may be formed to have a conductivity type that is different from that of the substrate 100. The source/drain regions 150 may be formed to extend into and/or span at least a top portion of the first sacrificial semiconductor pattern 115a. In some embodiments, the source/ drain regions 150 extend only partially into the top portion of the first sacrificial semiconductor pattern 115a.

Figure 10:
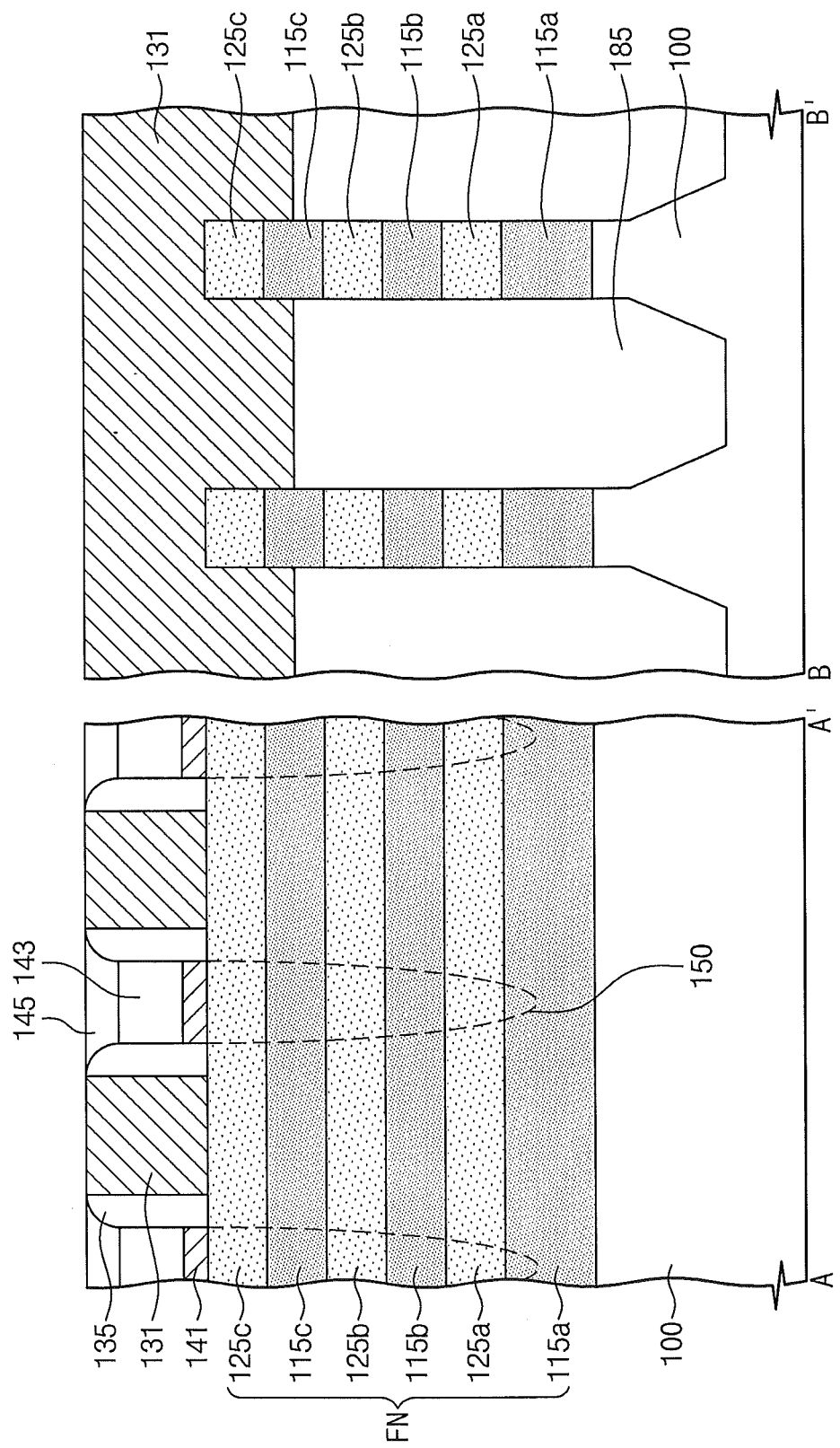

Referring to FIGS. 1 and 10, an interlayered insulating layer 143 and a capping insulating layer 145 may be formed to fill between the dummy gate patterns 131.

For example, the formation of the interlayered insulating layer 143 may include forming a preliminary interlayered insulating layer on the structure of FIG. 9 to fill spaces between the dummy gate patterns 131 and anisotropically etching the preliminary interlayered insulating layer without an etch mask (e.g., by an etch-back process). The etch-back process may be performed in an over-etch manner, and in this case, a top portion of the preliminary interlayered insulating layer may be recessed. For example, the interlayered insulating layer 143 may be locally formed between the dummy gate patterns 131. The interlayered insulating layer 143 may have a top surface that is lower than that of the dummy gate patterns 131. The interlayered insulating layer 143 may cover the capping semiconductor patterns 141 and may extend parallel to the y direction. The preliminary interlayered insulating layer may include a silicon oxide layer, which may be formed by a flowable CVD process.

The formation of the capping insulating layer 145 may include forming a preliminary capping insulating layer on the structure with the interlayered insulating layer 143 to fill spaces between the dummy gate patterns 131 and planarizing the preliminary capping insulating layer. The planarization process may be performed to expose the top surfaces of the dummy gate patterns 131. For example, the dummy gate patterns 131 may be formed to have top surfaces that are coplanar with that of the capping insulating layer 145. The capping insulating layer 145 cmay include a high-density plasma (HDP) oxide layer or a silicon nitride layer, which may be formed by a CVD process.

Figure 11:
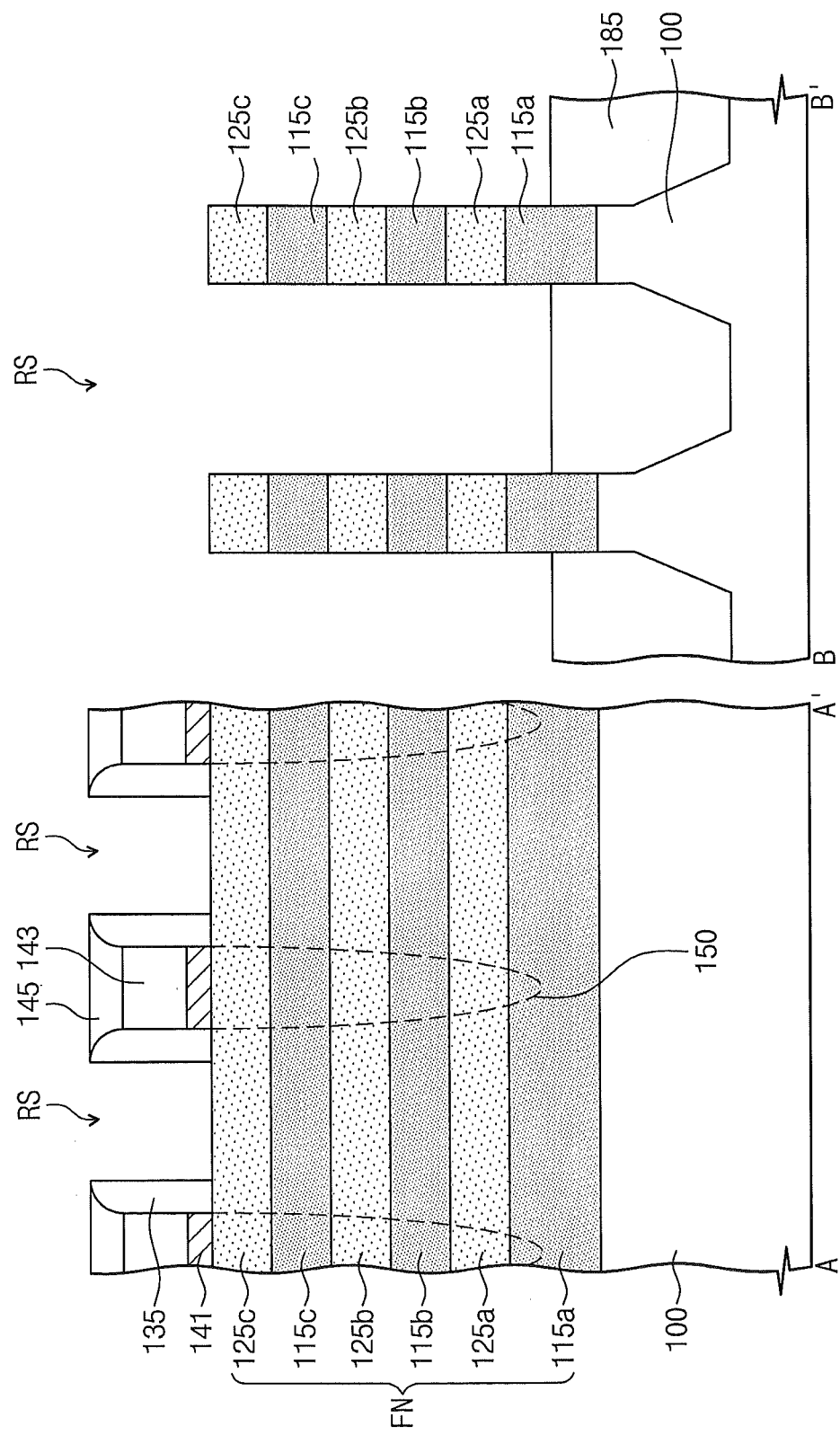

Referring to FIGS. 1 and 11, a dry and/or wet etching process may be performed to the structure of FIG. 10 to remove the dummy gate patterns 131 of FIG. 10.

For example, the process of etching the dummy gate patterns 131 may be performed using an etch recipe capable of selectively removing the dummy gate patterns 131 but suppressing the etching of the spacers 135 and the capping insulating layer 145. The process of etching the dummy gate patterns 131 may be performed to expose the stacks FN and the device isolation patterns 185. During the etching of the dummy gate patterns 131, the stacks FN may be partially etched to have a recessed top surface (i.e., lower than the bottom surface of the spacers 135).

After the removal of the dummy gate patterns 131, a dry and/or wet etching process may be performed to etch the device isolation patterns 185. The etching of the device isolation patterns 185 may be performed using an etch recipe capable of selectively etching the device isolation patterns 185 but suppressing the etching of the stacks FN. The etching of the device isolation patterns 185 may be performed to expose a sidewall of a lower portion (e.g., the first sacrificial semiconductor patterns 115a) of the stacks FN. For example, the sidewall of the first sacrificial semiconductor patterns 115a may be left partially covered with the device isolation patterns 185 remaining in the trenches T. The device isolation patterns 185 may have top surfaces positioned between top and bottom surfaces of the first sacrificial semiconductor pattern 115a.

As the result of the etching of the dummy gate patterns 131 of FIG. 10 and the device isolation patterns 185, recess regions RS may be formed between the capping insulating layers 145, when viewed in a plan view. For example, the recess regions RS may be formed to expose the sidewalls of the sacrificial semiconductor patterns 115a, 115b, and 115c and the channel semiconductor patterns 125a, 125b, and 125c below the capping insulating layers 145.

Figure 12:
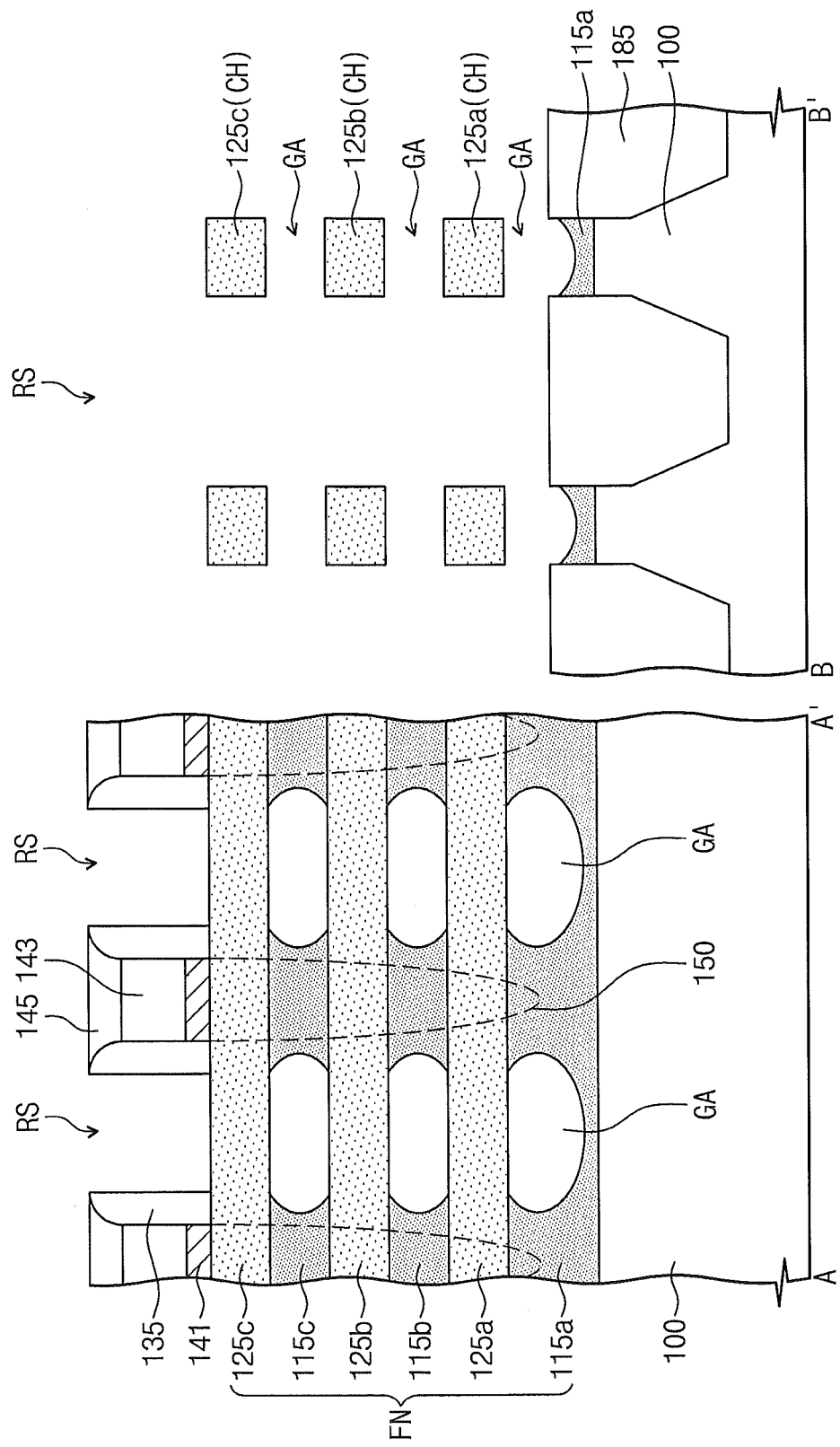

Referring to FIGS. 1 and 12, the sacrificial semiconductor patterns 115a, 115b, and 115c exposed by the recess region RS may be partially etched to form the gap regions GA exposing top and/or bottom surfaces of the channel semiconductor patterns 125a, 125b, and 125c. The gap regions GA may extend laterally beyond the recess region RS and may be continuously connected to the recess region RS. In other words, the gap regions GA can define a continuous void that extends around the channel semiconductor patterns 125a, 125b, and 125c to the recess regions RS. As a result, the channel semiconductor patterns 125a, 125b, and 125c may be top, bottom, and side surfaces that are exposed by the recess regions RS and the gap regions GA, thereby serving as the channel regions CH.

In the case where the first sacrificial semiconductor pattern 115a is thicker than the second and third sacrificial semiconductor patterns 115b and 115c, a portion of the first sacrificial semiconductor pattern 115a may remain between the substrate 100 and the gap region GA, even though the second and third sacrificial semiconductor patterns 115b and 115c are exposed in the recess region RS. For example, the portion of the first sacrificial semiconductor pattern 115a may remain between the device isolation patterns 185 exposed by the recess region RS and have a line-shaped structure extending parallel to the x direction. A top surface of the first sacrificial semiconductor pattern 115a between the substrate 100 and the gap region GA may be lower than that of the device isolation patterns 185 directly adjacent thereto.

In detail, the etching of the sacrificial semiconductor patterns 115a, 115b, and 115c may be performed using an etch recipe capable of selectively removing the sacrificial semiconductor patterns 115a, 115b, and 115c but suppressing the etching of the channel semiconductor patterns 125a, 125b, and 125c. For example, in the case where the channel semiconductor patterns 125a, 125b, and 125c contain silicon and the sacrificial semiconductor patterns 115a, 115b, and 115c contain silicon-germanium, the etching process may be performed using an etching solution containing peracetic acid. In certain embodiments, the etching solution may further contain hydrogen fluoride (HF) solution and deionized water.

As the result of the wet etching process, sidewalls of the sacrificial semiconductor patterns 115a, 115b, and 115c exposed by the gap regions GA may be formed to have concave sidewalls. Further, a top surface of the first sacrificial semiconductor pattern 115a exposed by the gap regions GA may be formed to have a downward concave shape. The channel semiconductor patterns 125a, 125b, and 125c exposed by the recess region RS may be partially etched, during the removal of the sacrificial semiconductor patterns 115a, 115b, and 115c.

Figure 13:
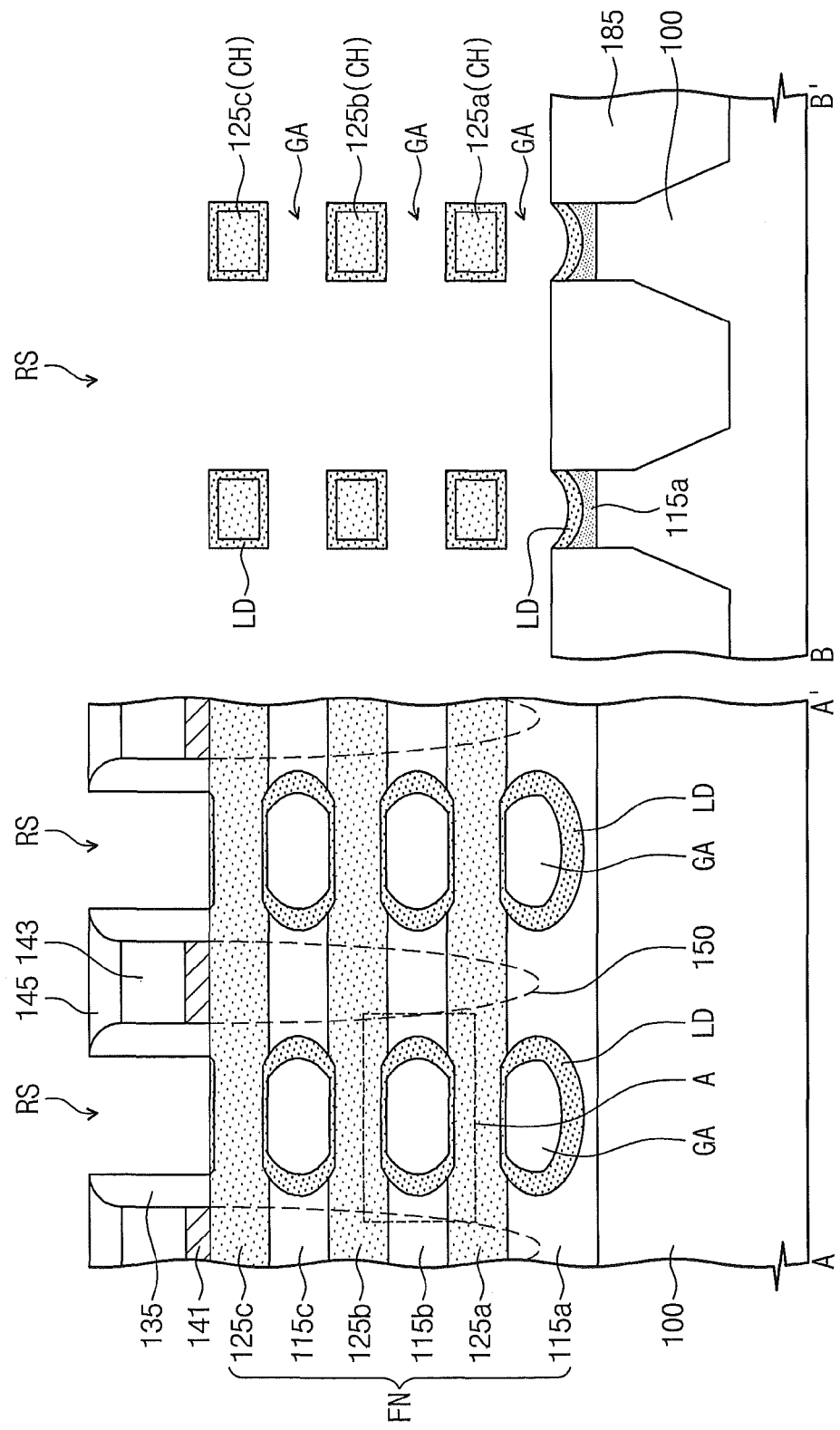
Figure 14:
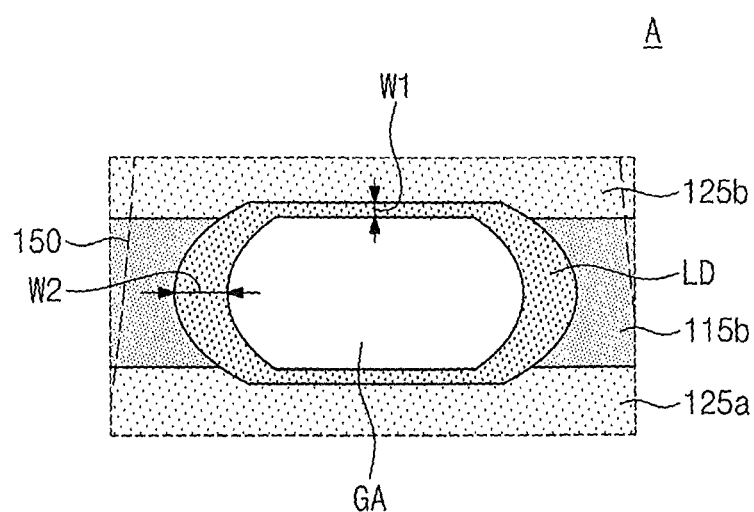
FIG. 14 is a sectional view magnifying a portion A of FIG. 13 illustrating a semiconductor oxide.

Referring to FIGS. 1, 13, and 14, an oxidation process may be performed to the structure of FIG. 12 to form the semiconductor oxide LD on the exposed surfaces of the sacrificial semiconductor patterns 115a, 115b, and 115c and the channel semiconductor patterns 125a, 125b, and 125c. In certain embodiments, the semiconductor oxide LD may have a dielectric constant less than that of the gate insulating layer GD. As an example, the semiconductor oxide LD may include a silicon oxide layer and/or a silicon-germanium oxide layer.

The oxidation process for forming the semiconductor oxide LD may be performed in a wet or dry manner. The oxidation process may be performed in such a way that the semiconductor oxide LD is formed thicker on the sacrificial semiconductor patterns 115a, 115b, and 115c than on the channel semiconductor patterns 125a, 125b, and 125c. For example, as shown in FIG. 14, the semiconductor oxide LD may be formed to have a thickness W1 on top or bottom surfaces of the channel semiconductor patterns 125a and 125b and have a thickness W2, which is greater than the thickness W1, on the concave sidewall of the second sacrificial semiconductor pattern 115b.

The difference between the thicknesses W1 and W2 may result from a difference in oxidation rate between the sacrificial semiconductor patterns 115a, 115b, and 115c and the channel semiconductor patterns 125a, 125b, and 125c. As described above, the sacrificial semiconductor patterns 115a, 115b, and 115c may be formed of a material, whose oxidation rate is greater than that of the channel semiconductor patterns 125a, 125b, and 125c. As an example, in the case where the sacrificial semiconductor patterns 115a, 115b, and 115c contain silicon-germanium and the channel semiconductor patterns 125a, 125b, and 125c contain silicon, the sacrificial semiconductor patterns 115a, 115b, and 115c may have an oxidation rate that is greater than that of the channel semiconductor patterns 125a, 125b, and 125c. In other words, a silicon oxide layer may be formed on the channel semiconductor patterns 125a, 125b, and 125c, and a silicon-germanium oxide layer may be formed on the sacrificial semiconductor patterns 115a, 115b, and 115c to be thicker than that of the silicon oxide layer. Further, by adjusting a content ratio between silicon and germanium contained in the sacrificial semiconductor patterns 115a, 115b, and 115c, it is possible to control the ratio of the oxidation rates of the sacrificial and channel semiconductor patterns 115a-115c and 125a-125c. For example, in the case where the sacrificial semiconductor patterns 115a, 115b, and 115c are formed of $Si_{0.3}Ge_{0.3}$ and the channel semiconductor patterns 125a, 125b, and 125c are formed of silicon, the sacrificial semiconductor patterns 115a, 115b, and 115c may have an oxidation rate that is three or more times greater than the oxidation rate of the channel semiconductor patterns 125a, 125b, and 125c. In terms of content ratio between silicon and germanium, at least one of the sacrificial semiconductor patterns 115a, 115b, and 115c may be different from the others.

Figure 15:
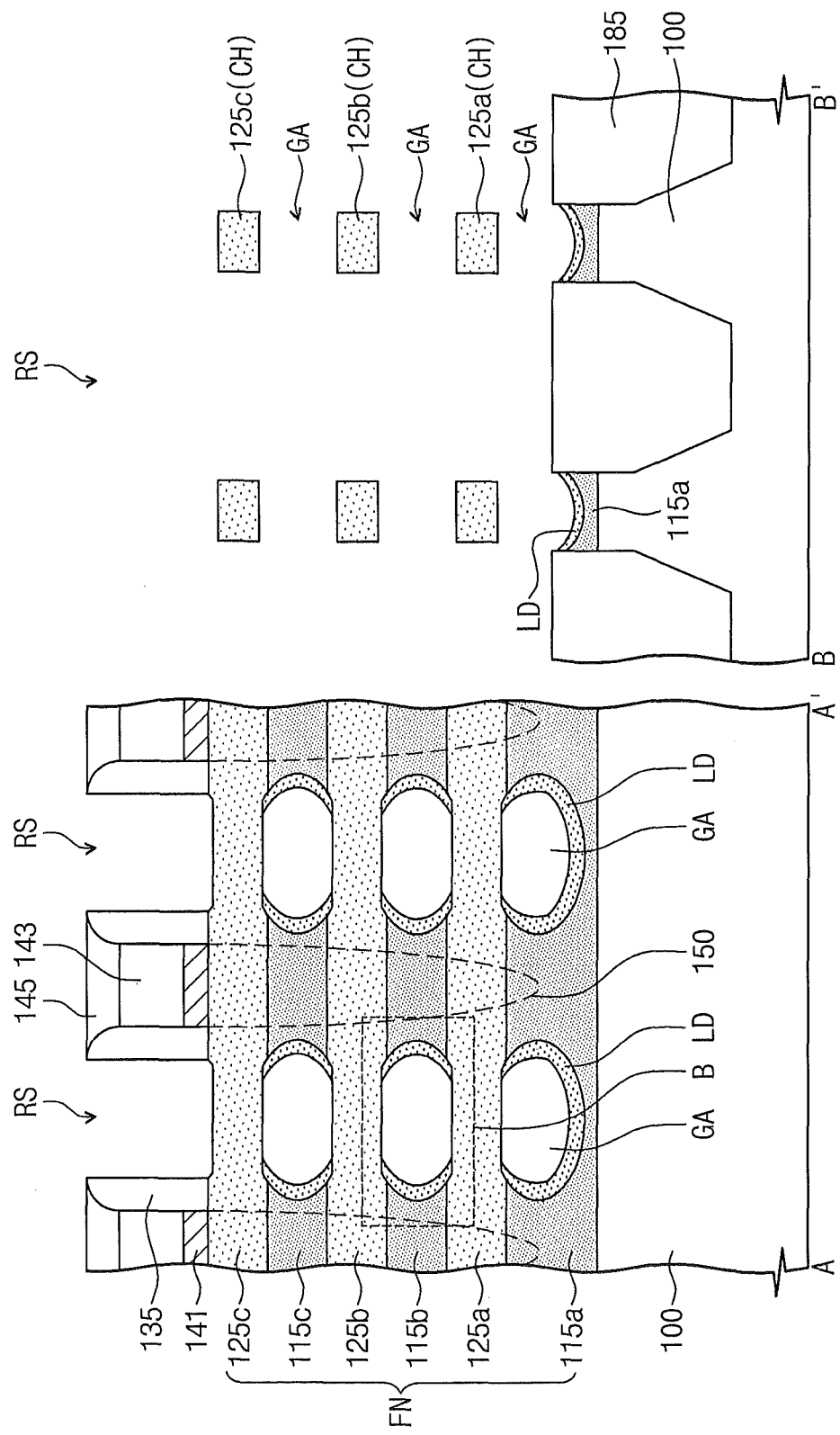
Figure 16:
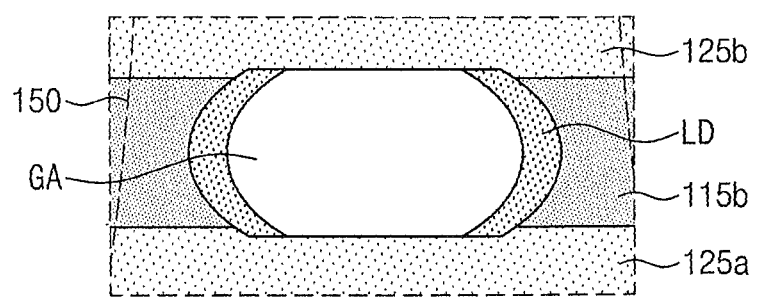
FIG. 16 is a sectional view magnifying a portion B of FIG. 15 illustrating a semiconductor oxide.

Referring to FIGS. 1, 15, and 16, a wet etching process may be performed to remove the semiconductor oxide LD from the surfaces of the channel semiconductor patterns 125a, 125b, and 125c. An etching solution including hydrogen fluoride solution may be used in the wet etching process. In certain embodiments, as shown in FIG. 16, the semiconductor oxide LD may be completely removed from the surfaces of the channel semiconductor patterns 125a, 125b, and 125c, and thereby, the channel semiconductor patterns 125a, 125b, and 125c may be exposed to the gap regions GA. Since the thickness of the semiconductor oxide LD is larger on the sacrificial semiconductor patterns 115a, 115b, and 115c than on the channel semiconductor patterns 125a, 125b, and 125c, the semiconductor oxide LD may remain on the sacrificial semiconductor patterns 115a, 115b, and 115c, even after the removal of the semiconductor oxide LD from the channel semiconductor patterns 125a, 125b, and 125c.

Referring back to FIGS. 1 through 3, the gate insulating layer GD and the gate electrode GE may be sequentially formed on the structure of FIG. 15. In certain embodiments, the gate insulating layer GD may be formed to cover the sacrificial semiconductor patterns 115a, 115b, and 115c covered with the semiconductor oxide LD, the channel semiconductor patterns 125a, 125b, and 125c, the recessed top surfaces of the device isolation patterns 185, and the sidewalls of the spacers 135. The gate electrode GE may be formed to fill the recess and gap regions RS and GA provided with the gate insulating layer GD and expose the top surfaces of the spacers 135 and the capping insulating layer 145. The gate insulating layer GD and the gate electrode GE may extend parallel to the y direction, as shown in FIG. 1.

The gate insulating layer GD may include at least one of high-k dielectric materials, whose dielectric constant is greater than that of the semiconductor oxide LD. As an example, the gate insulating layer GD may be formed of or include at least one of $HfO_2$, $ZrO_2$, or $Ta_2O_5$. The gate electrode GE may include a conductive metal nitride or a metallic material. In other words, the gate electrode GE may have a metal gate structure. The gate insulating layer GD and the gate electrode GE may be formed through a deposition process, such as a CVD or sputtering process, and a patterning process.

According to example embodiments of the inventive concept, provided is a method of fabricating a semiconductor device including gate-all-around (GAA) field effect transistors. The formation of the GAA field effect transistors may include growing semiconductor layers having an etch selectivity with respect to each other and patterning the semiconductor layers to form nanowires or nanotubes serving as channel regions of the field effect transistors. For example, the GAA field effect transistors may include channel semiconductor patterns, which serve as the channel regions, and each of which has a width ranging from several nanometers to several tens of nanometers and thereby has a structure of nanowire or nanotube. Further, the GAA field effect transistor may include a gate insulating layer and a gate electrode, which are formed to enclose each of the channel semiconductor patterns. In addition, the sacrificial semiconductor patterns may be formed of a material, whose oxidation rate is greater than that of the channel semiconductor patterns, and thus, a semiconductor oxide layer may be selectively formed on the sacrificial semiconductor pattern or between the sacrificial semiconductor pattern and the gate insulating layer. The semiconductor oxide layer may have a dielectric constant that is less than that of the gate insulating layer, and thus, parasitic capacitance between the gate electrode and the sacrificial semiconductor patterns can be reduced. Accordingly, the GAA field effect transistor of the semiconductor device can be fabricated to have improved electrical characteristics.

Figure 17:
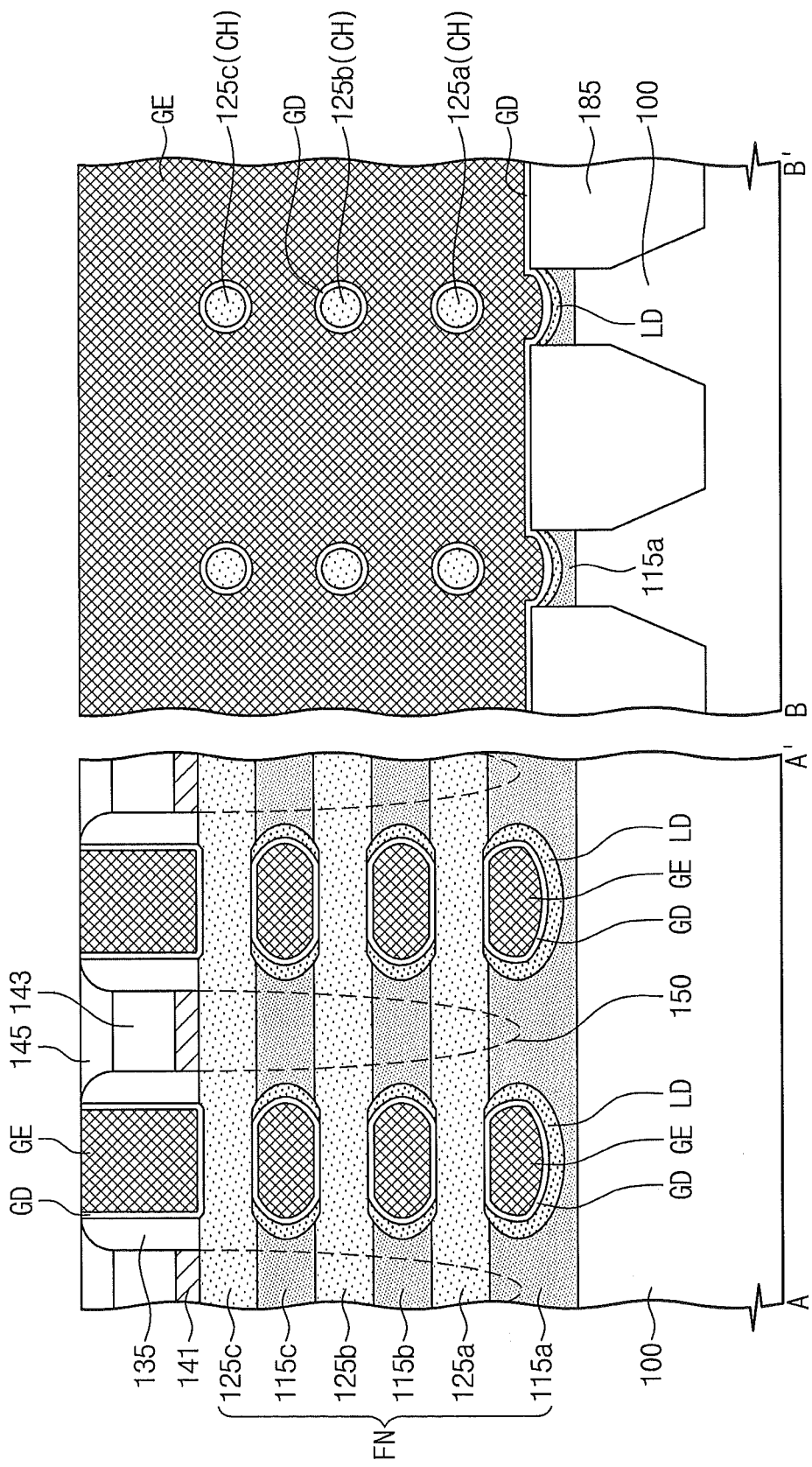
FIG. 17 is a sectional view illustrating sections taken along lines A-A' and B-B' of FIG. 1 illustrating semiconductor devices according to some example embodiments of the inventive concept.

FIG. 17 is a sectional view illustrating sections taken along lines A-A' and B-B' of FIG. 1 to illustrate a semiconductor device according to some example embodiments of the inventive concept.

Referring to FIG. 17, each of the channel regions CH may have a rounded profile, when viewed in a section view. For example, each of the channel regions CH may have a rounded cross-sectional shape such as a circle or ellipse. The rounded sectional profile of the channel regions CH may be achieved by performing a surface treatment process to the structure of FIG. 12. The surface treatment process may include, for example, exposing the structure of FIG. 12 to HCl-containing gas and then performing an annealing process in $H_2$ ambient.

Figure 18:
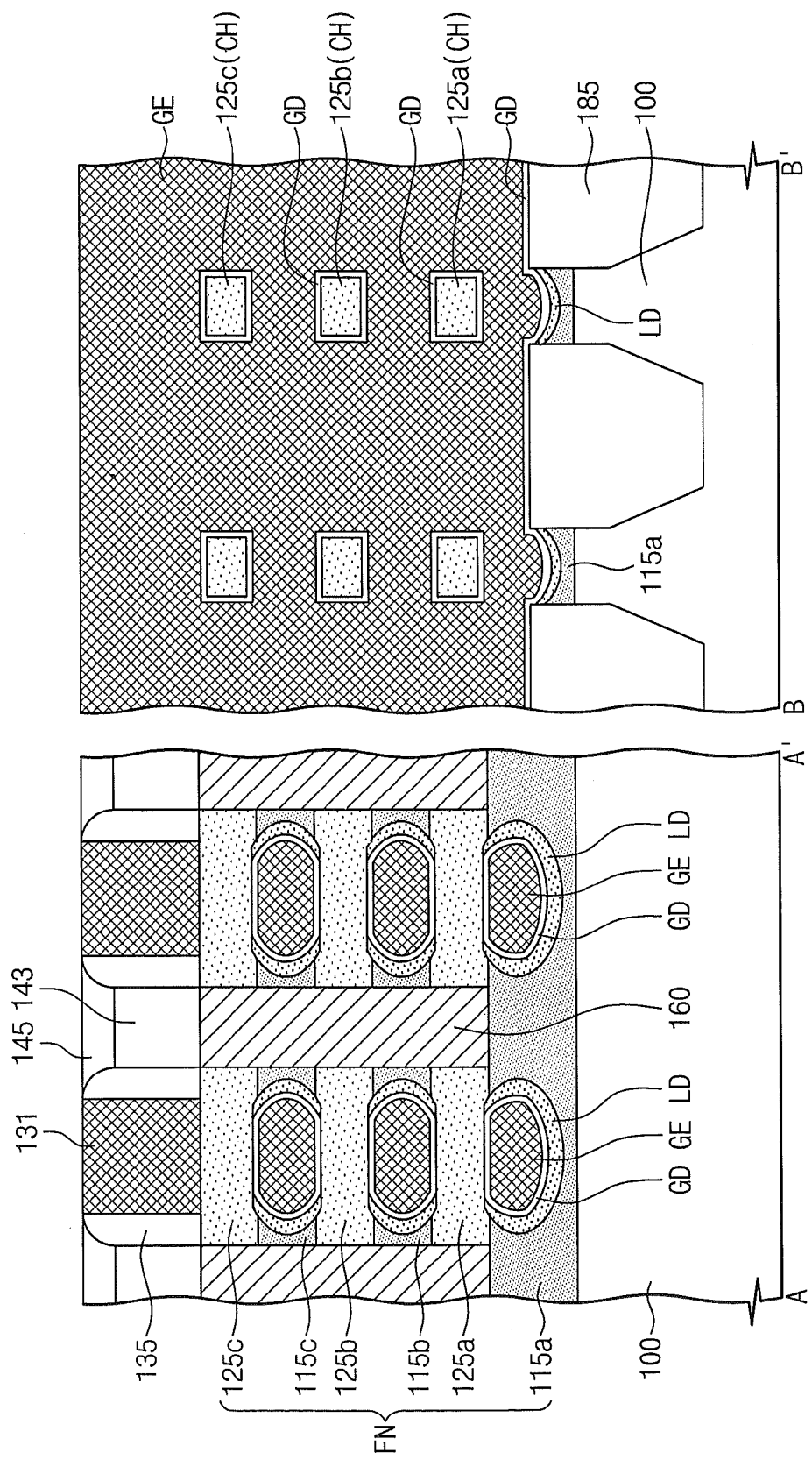
FIG. 18 is a sectional view illustrating sections taken along lines A-A' and B-B' of FIG. 1 illustrating semiconductor devices according to some example embodiments of the inventive concept.

FIG. 18 is a sectional view illustrating sections taken along lines A-A' and B-B' of FIG. 1 to illustrate a semiconductor device according to still other example embodiments of the inventive concept.

Referring to FIGS. 1 and 18, the stacks FN may include source/drain regions 160, which are formed to penetrate the channel semiconductor patterns 125a, 125b, and 125c and the second and third sacrificial semiconductor patterns 115b and 115c. When viewed in a plan view, the source/drain regions 160 may be two-dimensionally arranged on the substrate 10Q. In other words, the source/drain regions 160 may be provided in the stacks FN to be spaced apart from each other in the x and y directions.

In example embodiments, the source/drain regions 160 may include a semiconductor material having a single crystalline structure. For example, the source/drain regions 160 may include at least one of silicon, silicon-germanium, or compound semiconductors. In some embodiments, the source/drain regions 160 may include at least one of conductive metal nitrides or metals. The source/drain regions 160 may be doped to have a second conductivity type different from that of the substrate 100. In some embodiments, the source/drain regions 160 may extend into the first sacrificial semiconductor pattern 115a, although, in FIG. 18, the source/drain regions 160 are illustrated to have bottom surfaces coplanar with the top surface of the first sacrificial semiconductor pattern 115a.

Figure 19:
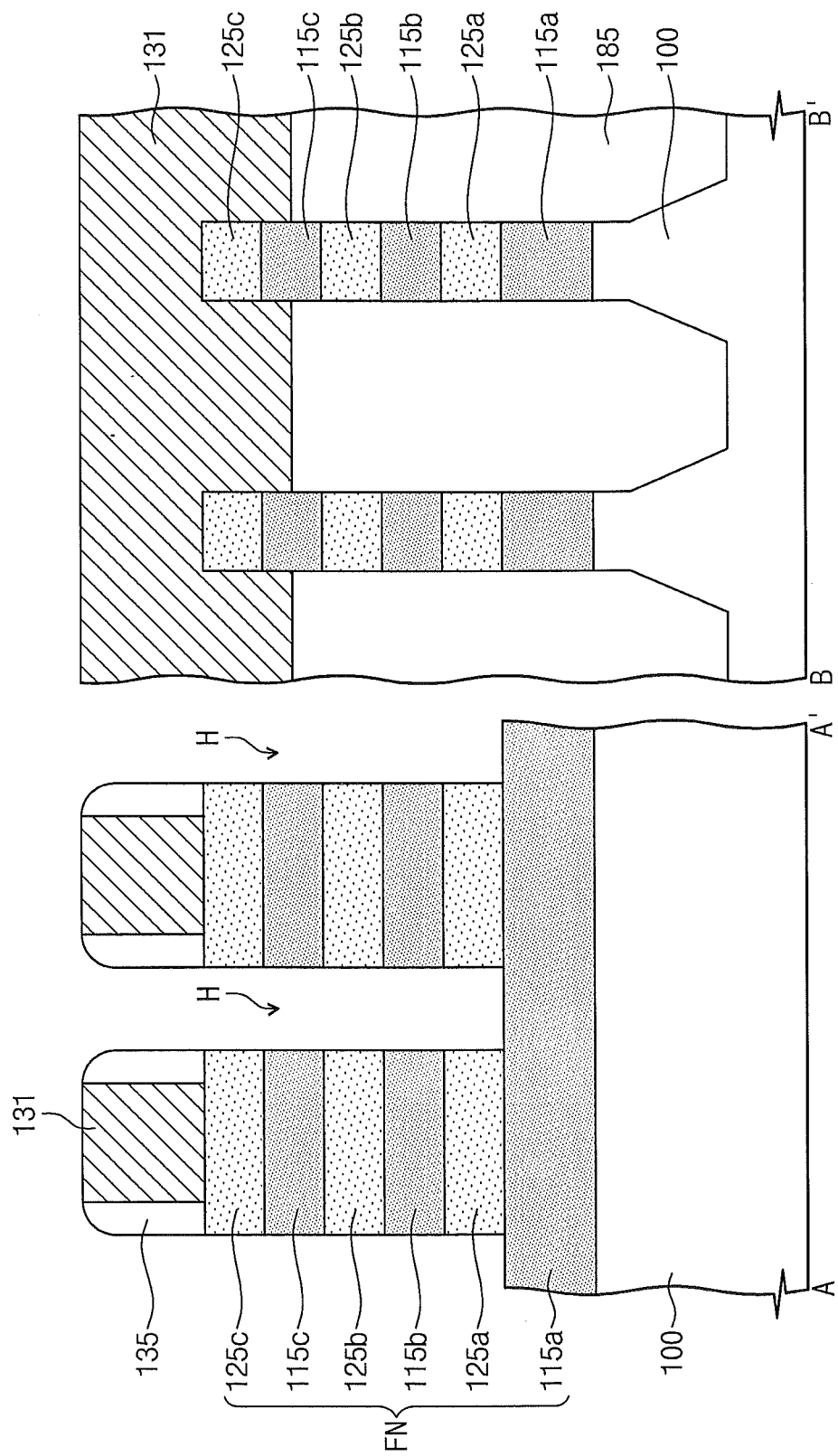
FIGS. 19 and 20 are sectional views taken along lines A-A' and B-B' of FIG. 1 illustrating methods of fabricating semiconductor devices according to some example embodiments of the inventive concept.
Figure 20:
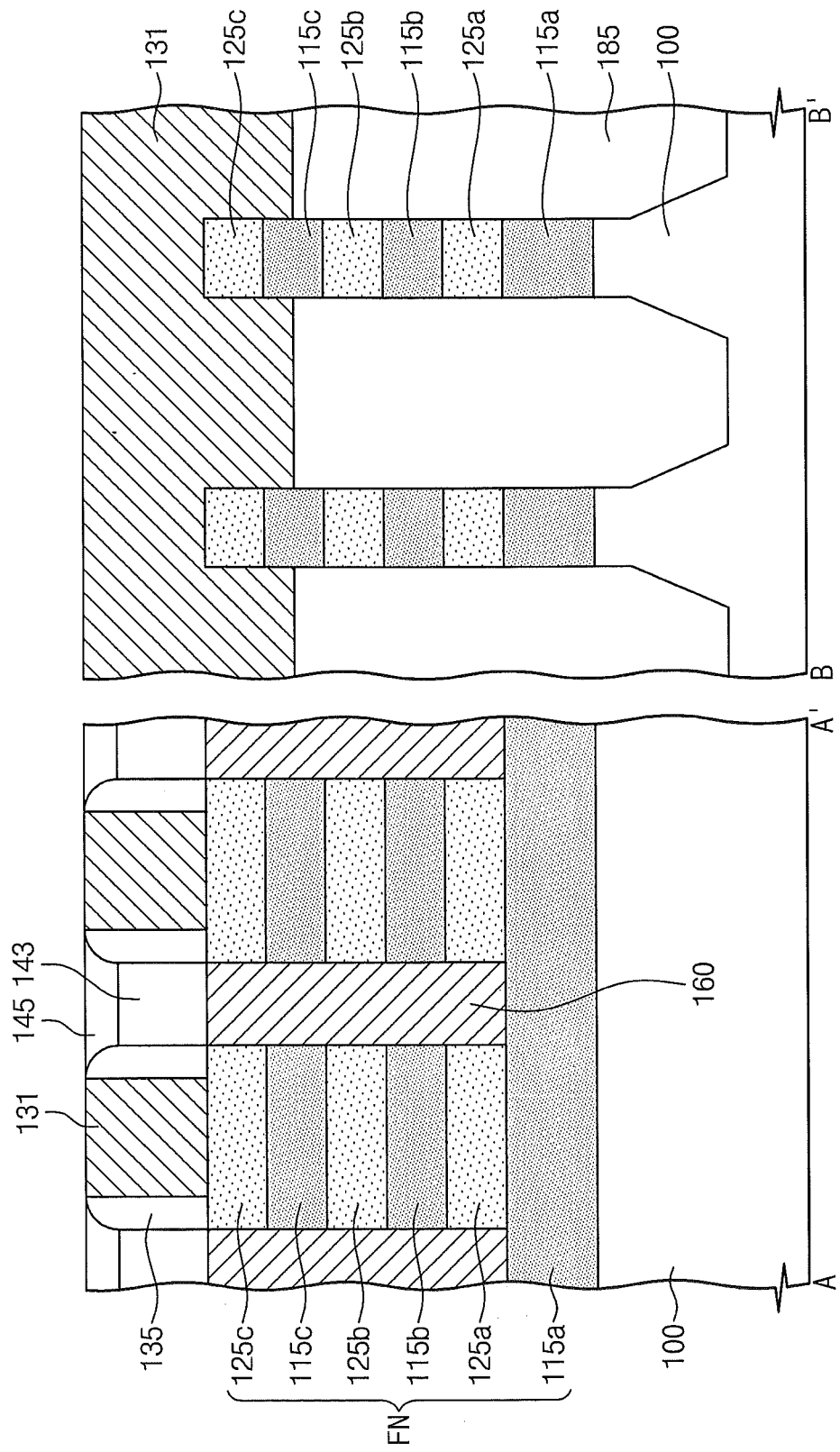

FIGS. 19 and 20 are sectional views taken along lines A-A' and B-B' of FIG. 1 to illustrate methods of fabricating semiconductor devices according to embodiments of the inventive concept.

Referring to FIGS. 1 and 19, the structure of FIG. 8 may be patterned to form holes H penetrating the channel semiconductor patterns 125a, 125b, and 125c and the second and third sacrificial semiconductor patterns 115b and 115c. The formation of the holes H may include forming a mask pattern on the structure of FIG. 8, and then, performing an etching process using the mask pattern as an etch mask. When viewed in a plan view, the holes H may be two-dimensionally arranged on the substrate 100. In other words, the holes H may be formed in the stacks FN to be spaced apart from each other in the x and y directions. Each of the holes H may be formed to expose the sidewalls of the channel semiconductor patterns 125a, 125b, and 125c, the sidewalls of the second and third sacrificial semiconductor patterns 115b and 115c, the top surface of the first sacrificial semiconductor pattern 115a, and the sidewalls of the device isolation patterns 185 directly adjacent thereto.

Referring to FIGS. 1 and 20, the source/drain regions 160 may be formed on the structure of FIG. 19 to fill the holes H. In example embodiments, the source/drain regions 160 may include at least one of silicon, silicon-germanium, or compound semiconductors. For example, the source/drain regions 160 may be formed by performing an epitaxial growth process using the first sacrificial semiconductor pattern 115a exposed by the holes H as a seed layer. The epitaxial growth process may be a chemical vapor deposition (CVD) process or a molecular beam epitaxy (MBE) process. In other example embodiments, the source/drain regions 160 may include at least one of conductive metal nitrides or metals. For example, the source/drain regions 160 may be formed by a deposition process, such as a CVD or sputtering process, and a patterning process.

In example embodiments, the formation of the source/drain regions 160 may be performed in an in-situ manner. In some embodiments, the formation of the source/drain regions 160 may further include an ion implantation process of injecting impurities into the source/drain regions 160.

After the formation of the source/drain regions 160, the interlayered insulating layer 143 may be formed to cover the source/drain regions 160 and extend parallel to the y direction. The capping insulating layer 145 may be formed on the interlayered insulating layer 143 to cover upper portions of the spacers 135 and leaving the top surfaces of the gate electrodes GE exposed. The capping insulating layer 145 may be formed to have a top surface that is coplanar with that of the gate electrodes GE. Thereafter, the process described with reference to FIGS. 11 through 13 and FIG. 15 may be further performed to fabricate the semiconductor device of FIG. 18 in some embodiments according to the inventive concept.

Figure 21:
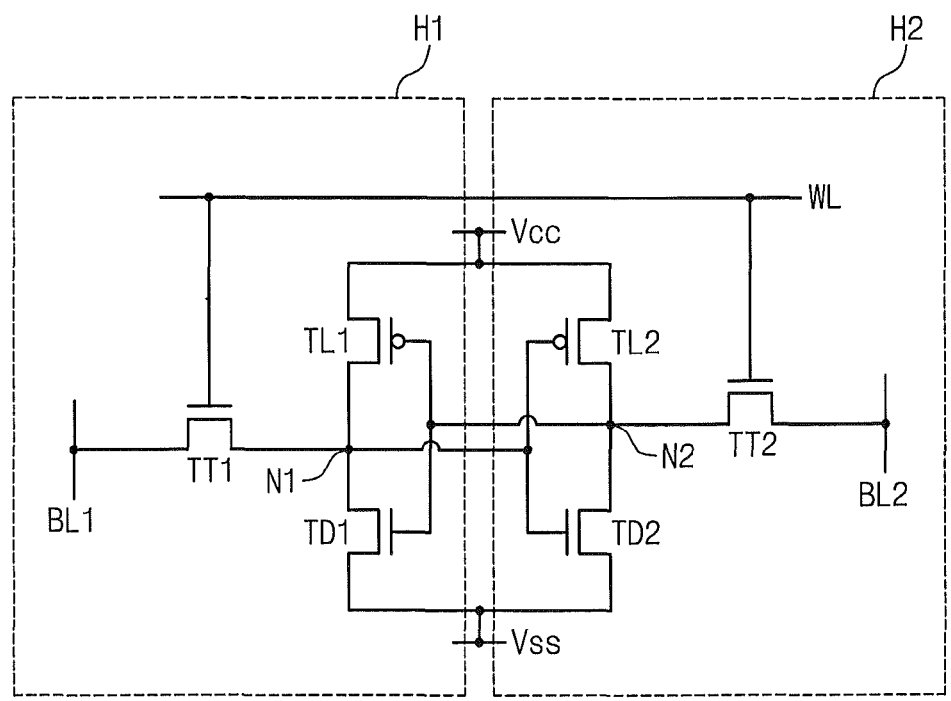
FIG. 21 is an equivalent circuit diagram illustrating a CMOS SRAM cell including a semiconductor device according to example embodiments of the inventive concept.

FIG. 21 is an equivalent circuit diagram illustrating a CMOS SRAM cell including a semiconductor device according to example embodiments of the inventive concept. Referring to FIG. 21, the CMOS SRAM cell may include a pair of driver transistors TD1 and TD2, a pair of transfer transistors TT1 and TT2, and a pair of load transistors TL1 and TL2. The driver transistors TD1 and TD2 may be pull-down transistors, the transfer transistors TT1 and TT2 may be pass transistors, and the load transistors TL1 and TL2 may be pull-up transistors. The driver transistors TD1 and TD2 and the transfer transistors TT1 and TT2 may be NMOS transistors, and the load transistors TL1 and TL2 may be PMOS transistors. At least one of the driver, transfer, and load transistors TD1, TD2, TT1, TT2, TL1, and TL2 may be provided in the form of the gate-all-around (GAA) field effect transistor according to example embodiments of the inventive concept.

The first driver transistor TD1 and the first transfer transistor TT1 may be connected in series to each other. A source region of the first driver transistor TD1 may be electrically connected to a ground line Vss, and a drain region of the first transfer transistor TT1 may be electrically connected to a first bit line BL1. The second driver transistor TD2 and the second transfer transistor TT2 may be connected in series to each other. A source region of the second driver transistor TD2 may be electrically connected to the ground line Vss, and a drain region of the second transfer transistor TT2 may be electrically connected to a second bit line BL2.

Source and drain regions of the first load transistor TL1 may be electrically connected to a power line Vcc and a drain region of the first driver transistor TD1, respectively. Source and drain regions of the second load transistor TL2 may be electrically connected to the power line Vcc and a drain region of the second driver transistor TD2, respectively. The drain region of the first load transistor TL1, the drain region of the first driver transistor TD1, and a source region of the first transfer transistor TT1 may serve as a first node N1. The drain region of the second load transistor TL2, the drain region of the second driver transistor TD2, and a source region of the second transfer transistor TT2 may serve as a second node N2. Gate electrodes of the first driver transistor TD1 and the first load transistor TL1 may be electrically connected to the second node N2, and gate electrodes of the second driver transistor TD2 and the second load transistor TL2 may be electrically connected to the first node N1. Gate electrodes of the first and second transfer transistors TT1 and TT2 may be electrically connected to a word line WL. The first driver transistor TD1, the first transfer transistor TT1, and the first load transistor TL1 may constitute a first half cell H1, while the second driver transistor TD2, the second transfer transistor TT2, and the second load transistor TL2 may constitute a second half cell H2.

Example embodiments of the inventive concept are not limited to the example of SRAM, and may be applied or modified to realize a logic device, DRAM, MRAM, other semiconductor devices, and fabricating methods thereof.

Figure 22:
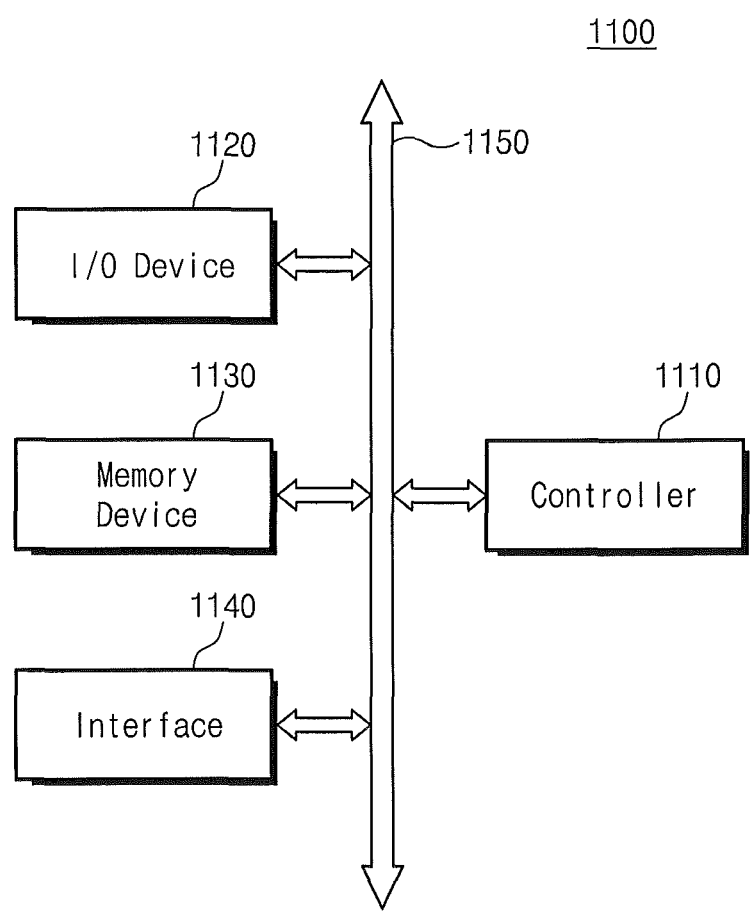
FIG. 22 is a schematic block diagram illustrating electronic systems including a semiconductor device according to example embodiments of the inventive concept.

FIG. 22 is a schematic block diagram illustrating an example of electronic systems including a semiconductor device according to example embodiments of the inventive concept.

Referring to FIG. 22, an electronic system 1100 may include a controller 1110, an input-output (I/O) device 1120, a memory device 1130, an interface 1140, and a bus 1150. The controller 1110, the input-output device 1120, the memory device 1130 and/or the interface 1140 may be connected or coupled to each other via the bus 1150 serving as a pathway for data communication.

The controller 1110 may include, e.g., at least one of a microprocessor, a digital signal processor, a microcontroller, or another logic device. The other logic device may have a similar function to any one of the microprocessor, the digital signal processor, and the microcontroller. The input-output device 1120 may include a keypad, keyboard, a display device, and so forth. The memory device 1130 may be configured to store data and/or command. The interface 1140 may transmit data to a communication network or may receive data from a communication network. The interface 1140 may operate wirelessly or via a wire. For example, the interface 1140 may include an antenna for wireless communication or a transceiver for cable communication. The electronic system 1100 may further include a fast DRAM device and/or a fast SRAM device which acts as a cache memory for improving an operation of the controller 1110. A semiconductor device according to example embodiments of the inventive concept may be provided in the memory device 1130 or as a part of the controller 1110 and/or the I/O device 1120.

The electronic system 1100 may be applied to, for example, a personal digital assistant (PDA), a portable computer, a web tablet, a wireless phone, a mobile phone, a digital music player, a memory card, or other electronic products. The other electronic products may receive or transmit information data wirelessly.

Figure 23:
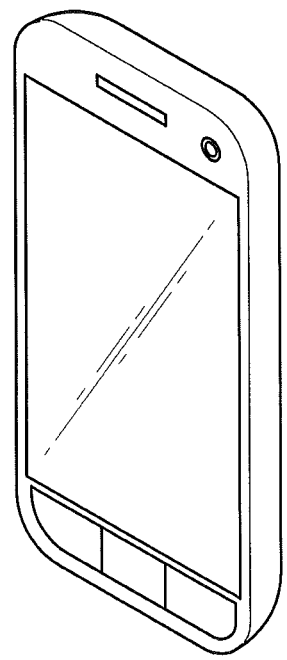
FIG. 23 is a schematic view illustrating an example of an electronic device, to which the electronic system according to example embodiments of the inventive concept can be applied.

FIG. 23 is a schematic view illustrating an example of various electronic devices, to which the electronic system 1100 of FIG. 22 can be applied. As shown in FIG. 23, the electronic system 1100 of FIG. 22 can be applied to realize a mobile phone 1200. However, it will be understood that, in other embodiments, the electronic system 1100 of FIG. 22 may be applied to portable notebook computers, MP3 players, navigation systems, solid state disks (SSDs), automobiles, and/or household appliances.

According to example embodiments of the inventive concept, semiconductor devices can be provided with a field effect transistor of a gate-all-around (GAA) structure and a method of fabricating the same. For example, the field effect transistor may include at least one channel region, which is enclosed by a gate insulating layer and a gate electrode. The at least one channel region can be formed to have a width ranging from several nanometers to several tens of nanometers and thereby to have a nanowire or nanotube structure. Accordingly, it is possible to reduce a magnitude of electric field exerted from the source/drain regions to the channel region and thereby suppress a short channel effect of the transistor. In addition, the gate insulating layer may be formed of or include a high-k dielectric material, it is possible to decrease a gate leakage current, compared with the case that a silicon oxide layer is used for the gate insulating layer.

Furthermore, a semiconductor oxide layer may be further formed between the gate insulating layer and the sacrificial semiconductor patterns. The semiconductor oxide layer may be formed to have a dielectric constant that is less than that of the gate insulating layer, which may reduce parasitic capacitance between the gate electrode and the sacrificial semiconductor patterns. As a result, the semiconductor device may have improved electrical characteristics.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
   a first semiconductor pattern and a second semiconductor pattern sequentially stacked on one another on a substrate;
   a gate electrode on the second semiconductor pattern extending into a gap region delimited by a sidewall of the first semiconductor pattern and a bottom surface of the second semiconductor pattern;
   a gate insulating layer between the gate electrode and the first and second semiconductor patterns;
   a semiconductor oxide between the gate insulating layer and the first semiconductor pattern, the semiconductor oxide having a dielectric constant that is less than that of the gate insulating layer,
   wherein the semiconductor oxide extends between the gate electrode and the substrate,
   a source region on a first side of the gate electrode; and
   a drain region on a second side of the gate electrode opposite the first side, wherein the semiconductor oxide and the gate insulating layer are located together on both the first and second sides of the gate electrode located between tops and bottoms of the source and drain regions so that the semiconductor oxide and the gate insulating layer are configured to reduce parasitic coupling between the gate electrode and the first semiconductor pattern.

2. The device of claim 1, wherein the first semiconductor pattern comprises a material having an etch selectivity with respect to the second semiconductor pattern and has an oxidation rate that is greater than that of the second semiconductor pattern.

3. The device of claim 1, wherein the first and second semiconductor patterns each comprise a respective epitaxial layer.

4. The device of claim 1, further comprising:
   wherein the source and drain regions penetrate the first and second semiconductor patterns respectively; and
   wherein each of the source and drain regions comprise at least one of single crystalline semiconductor materials, conductive metal nitrides, and metals.

5. The device of claim 1, wherein the first semiconductor pattern comprises a portion between the semiconductor oxide and the substrate.

6. The device of claim 1, wherein the gate electrode has a metal gate structure including at least one of a conductive metal nitride layer and a metal layer.

7. The device of claim 1, further comprising:
   a third semiconductor pattern on the second semiconductor pattern; and
   a fourth semiconductor pattern on the third semiconductor pattern, the fourth semiconductor pattern penetrating the gate electrode,
   wherein the third and first semiconductor patterns comprise a first material, and the fourth and second semiconductor patterns comprise a second material.

8. The device of claim 7, wherein the first semiconductor pattern is thicker than the third semiconductor pattern.

9. A gate-all-around (GAA) semiconductor device, comprising:
   a fin structure including alternatingly layered first and second semiconductor patterns;
   a source region extending into the alternatingly layered first and second semiconductor patterns;
   a drain region extending into the alternatingly layered first and second semiconductor patterns;

a gate electrode extending between the source region and the drain region and surrounding channel portions of the second semiconductor patterns between the source region and the drain region to define gaps between the source and drain regions;

a semiconductor oxide on first side walls of the gaps that face the source and drain regions and absent from at least one of second side walls of the gaps that face the second semiconductor patterns; and a gate insulating layer on the first side walls of the gaps between the gate electrode and the semiconductor oxide, wherein the first semiconductor patterns are on the first side walls of the gaps on the gate insulating layer opposite the semiconductor oxide, wherein the semiconductor oxide has a dielectric constant that is less than that of the gate insulating layer such that the semiconductor oxide and the gate insulating layer are configured to reduce parasitic coupling between the gate electrode and the first semiconductor pattern.

10. The GAA device of claim 9 wherein the semiconductor oxide is located on lowest one of the second side walls between the gate electrode and the substrate.

11. The GAA device of claim 9 wherein the gate insulating layer surrounds the channel portions.

12. The GAA device of claim 11 wherein the gate insulating layer contacts the channel portions.

* * * * *